(12) United States Patent
Fujimori

(10) Patent No.: US 7,645,545 B2
(45) Date of Patent: *Jan. 12, 2010

(54) COLORANT-CONTAINING CURABLE COMPOSITION, COLOR FILTER AND PRODUCTION METHOD THEREOF

(75) Inventor: Toru Fujimori, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 486 days.

This patent is subject to a terminal disclaimer.

(21) Appl. No.: 11/412,880

(22) Filed: Apr. 28, 2006

(65) Prior Publication Data

US 2006/0246364 A1    Nov. 2, 2006

(30) Foreign Application Priority Data

Apr. 28, 2005    (JP) .............................. 2005-132048

(51) Int. Cl.
*G03F 7/00* (2006.01)
*G02B 5/20* (2006.01)

(52) U.S. Cl. .................... 430/7; 430/270.1; 430/281.1; 430/288.1

(58) Field of Classification Search ................. 540/121, 540/133
See application file for complete search history.

(56) References Cited

U.S. PATENT DOCUMENTS

| | | | |
|---|---|---|---|
| 5,234,791 A | 8/1993 | Dammel et al. | |
| 5,284,943 A | 2/1994 | Tai et al. | |
| 5,478,680 A | 12/1995 | Hishiro et al. | |
| 5,804,102 A | 9/1998 | Oi et al. | |
| 5,830,267 A | 11/1998 | Zambounis et al. | |
| 6,589,672 B1 | 7/2003 | Kobayashi et al. | |
| 2002/0045111 A1 | 4/2002 | Machiguchi et al. | |
| 2005/0113478 A1* | 5/2005 | Suzuki | 522/71 |
| 2006/0257762 A1 | 11/2006 | Fujimori | |
| 2007/0072096 A1 | 3/2007 | Takakuwa et al. | |
| 2007/0190435 A1 | 8/2007 | Takakuwa et al. | |
| 2007/0212623 A1 | 9/2007 | Takakuwa et al. | |

FOREIGN PATENT DOCUMENTS

| JP | 1-102469 A | 4/1989 |
|---|---|---|
| JP | 2-127602 A | 5/1990 |
| JP | 2-199403 A | 8/1990 |
| JP | 2-276866 A | 11/1990 |
| JP | 3-195783 A | 8/1991 |
| JP | 6-75375 A | 3/1994 |
| JP | 7-013014 A | 1/1995 |
| JP | 07-140654 A | 6/1995 |
| JP | 7-111485 B2 | 11/1995 |
| JP | 11-302285 | 11/1999 |
| JP | 2002-14222 A | 1/2002 |
| JP | 2002-196481 A | 7/2002 |
| JP | 2002-278056 A | 9/2002 |
| JP | 2002-338825 A * | 11/2002 |
| JP | 2004-139050 A | 5/2004 |
| JP | 2004-295116 A | 10/2004 |
| JP | 2005-227722 A | 8/2005 |
| JP | 2005-266149 A | 9/2005 |
| WO | 2005-083521 A1 | 9/2005 |

OTHER PUBLICATIONS

Computer-generated translation of JP 2002-338825 (Nov. 2002).*

* cited by examiner

*Primary Examiner*—John A. McPherson
(74) *Attorney, Agent, or Firm*—Sughrue Mion, PLLC

(57) ABSTRACT

A colorant-containing curable composition containing a tetraazaporphyrin compound represented by formula (1), wherein rings $A^1$, $A^2$, $A^3$, and $A^4$ each independently represent a benzene ring or a pyridine ring, at least one of the rings $A^1$, $A^2$, $A^3$, and $A^4$ represents a pyridine ring, $R^1$ and $R^2$ each independently represent a hydrogen atom or an alkyl group provided that $R^1$ and $R^2$ are not hydrogen atoms at the same time, m represents an integer of 1 to 8, and n is an integer of 1 to 4.

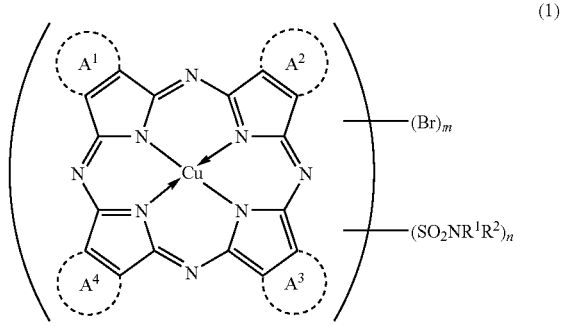

(1)

16 Claims, No Drawings

COLORANT-CONTAINING CURABLE COMPOSITION, COLOR FILTER AND PRODUCTION METHOD THEREOF

CROSS-REFERENCE TO RELATED APPLICATION

This application claims priority under 35 USC 119 from Japanese patent Application Nos. 2005-132048, the disclosure of which is incorporated by reference herein.

BACKGROUND OF THE INVENTION

1. Field of the Invention

The invention relates to a colorant-containing curable composition containing a dye favorable for forming a color filter for use in liquid crystal display devices and solid-state imaging devices, a dye-containing color filter, and a production method thereof.

2. Description of the Related Art

Dyeing, printing, electrodeposition and pigment dispersion methods have been known as the methods of producing a color filter for use in liquid crystal display devices (LCDs) and solid-state imaging devices (CCD, CMOS, and the like).

Among them, the pigment dispersion method is a method of producing a color filter by photolithography by using radiation ray-sensitive colored compositions containing a pigment dispersed in various photosensitive compositions, and has an advantage that the resulting products are resistant to light, heat, and others, because they contain a pigment. Because photolithographic patterning is higher in positional precision, the method has been employed widely as a method favorable for producing color filters for large-screen, high-definition color displays.

In the pigment dispersion method, a color filter is prepared by forming colored pixels in a desirable number of color tones, by forming a coated film by coating and drying a radiation ray-sensitive composition on a glass substrate, for example, by a spin coater or a roll coater, exposing the coated film through a pattern to light, and developing the film, and additionally, repeating the operation for respective colors. Negative-type photosensitive compositions containing an alkali-soluble resin, a photopolymerizable monomer, and a photopolymerization initiator are known as the compositions for use in the pigment dispersion method (e.g., Japanese Patent Application Laid-Open (JP-A) Nos. 2-199403, 4-76062, 5-273411, 6-184482, and 7-140654).

On the other hand, recently, there exists a need for further improvement in definition of the color filters for solid-state imaging devices. However, it is difficult to improve the definition further with conventional pigment dispersion systems, and, because of the problem of unevenness in color caused by bulky pigment particles, the systems are not suited for applications that demand fine patterning, such as solid-state imaging devices, Considering these problems, a system containing a solvent- or water-soluble dye instead of pigment is disclosed (e.g., JP-A No. 2002-278056).

However, such dye-containing curable compositions have the following new problems (1) to (4) and demand further improvement:

(1) Normally, it is difficult to obtain a liquid curable composition having a desirable spectrum, because the dye is less soluble in aqueous alkaline solutions and organic solvents.

(2) It is difficult to control the solubility (developing property) of hardened and unhardened areas, because the dye often interacts with other components in the curable composition.

(3) It is necessary to add a dye in a greater amount when the dye has a low molar absorption coefficient ($\epsilon$), and thus, to relatively reduce the amounts of the polymerizable compound (monomer), binder, and other components such as photopolymerization initiator in the curable composition, resulting in problems of deterioration of the hardening property of the composition and the heat resistance and developing property after hardening.

(4) Dyes are generally lower in light resistance and heat resistance than pigments.

In addition, different front the color filters for production of semiconductors, the color filters for solid-state imaging devices demand a film thickness of 1.5 μm or less, and thus, it is necessary to add a colorant in a greater amount in the curable composition, which raises the similar problems.

Accordingly, in production of high-definition color filters, it was difficult to satisfy the practical requirements for fine thin-film colored patterns. Thus, there exists a need for development of a dye and a curable composition that solve the problems above.

SUMMARY OF THE INVENTION

The invention, which was made in view of the problems above, provides a colorant-containing curable composition, a color filter and a production method thereof.

A first aspect of the invention provides a colorant-containing curable composition, the colorant comprising a compound represented by the following Formula (1) or its tautomer:

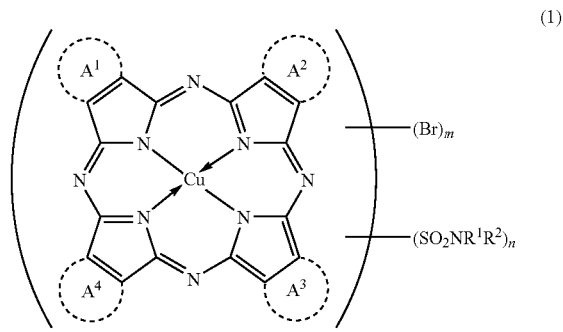

In Formula (1) above, rings $A^1$, $A^2$, $A^3$, and $A^4$ each independently represent a group represented by structure 1 or 2:

Structure 1

Structure 2 and at least one of the rings $A^1$, $A^2$, $A^3$, and $A^4$ represents a group represented by structure 2:

$R^1$ and $R^2$ each independently represent a hydrogen atom or a substituted or unsubstituted alkyl group; m represents an integer of 1 to 8; and n is an integer of 1 to 4. However, $R^1$ and $R^2$ are not hydrogen atoms at the same time.

A second aspect of the invention provides a color filter comprising a compound represented by Formula (1) above or its tautomer.

A third aspect of the invention provides a color filter prepared by using the colorant-containing curable composition above.

A fourth aspect of the invention provides a method of producing a color filter, comprising coating the colorant-containing curable composition above on a support, exposing the composition through a mask to light, and forming a pattern by developing the composition.

The production method may further comprise, as needed, a step of hardening the pattern by heating and/or light exposure; and these steps may be repeated multiple times, in which the dye may be changed to form a filter in multiple colors.

DESCRIPTION OF THE PREFERRED EMBODIMENTS

Hereinafter, the colorant-containing curable composition, the color filter and the production method thereof according to the invention will be described in detail.

(Colorant-Containing Curable Composition)

The colorant-containing curable composition according to the invention (hereinafter, also referred to as the "composition according to the invention") contains at least a colorant, and the colorant comprises a compound represented by Formula (1) shown below. The composition normally contains a solvent additionally. It may also contain, as needed, other additives such as binder, polymerizable compound, photopolymerization initiator, crosslinking agent, photosensitive agent, and photochemical acid generator.

Specifically, when the composition according to the invention is a negative composition that hardens by radical polymerization, the composition may contain, in addition to a colorant, additives such as solvent, polymerizable compound (monomer), binder (preferably alkali-soluble binder), and photopolymerization initiator, and optionally a crosslinking agent as needed.

When the composition according to the invention is a negative composition that hardens by acid condensation, it may contain, in addition to a colorant, additives such as solvent, crosslinking agent, binder (preferably alkali-soluble binder), and photochemical acid generator.

When the composition according to the invention is a positive composition, it may contain, in addition to a colorant, additives such as solvent, hardening agent, and photosensitive agent or photochemical acid generator.

<Colorant>

The composition according to the invention contains at least one of the compounds (tetraazaporphyrin compounds) represented by the following Formula (1) (hereinafter, also referred to as the "colorant compound according to the invention") as the colorant. The composition according to the invention may contain only one of the compounds represented by Formula (1) or two or more of them. The scope of the compound represented by Formula (1) (colorant compound according to the invention) includes its tautomers (the same shall apply hereinafter).

In particular, use of a tetraazaporphyrin compound represented by the following Formula 1 as the colorant leads to favorable color tone because of its molar absorption coefficient ε and color value, and results in a colored composition superior in heat resistance and light resistance, favorable in the developing property in unhardened area and the film remaining ratio in hardening area, and superior in pattern-forming property. In addition, the composition according to the invention is free from the concern about deterioration of various properties during the production process and thus, can improve productivity.

Hereinafter, the colorant compound according to the invention will be described in detail.

The colorant compound according to the invention represented by the following Formula (1) is an organic solvent-soluble dye having a favorable molar absorption coefficient ε and color value, and it is also a compound that has unprecedentedly high light resistance and heat resistance and is easily soluble, as needed, in water or solvents.

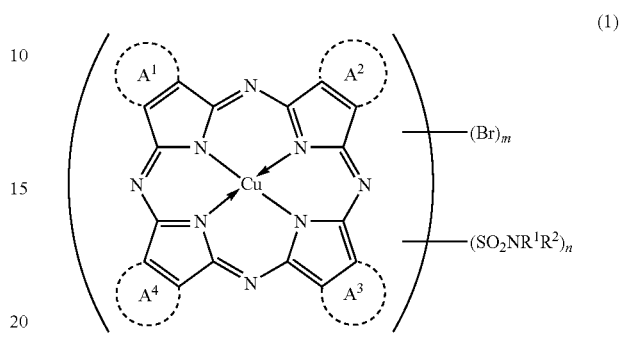

(1)

In Formula (1), rings $A^1$, $A^2$, $A^3$, and $A^4$ each independently represent the following aromatic ring (i.e., structure 1 or 2), and there are multiple isomers, depending to the positions of the fused rings and the substitution sites of the substituent groups bound thereto.

Structure 1

Structure 2

At least one of rings $A^1$, $A^2$, $A^3$, and $A^4$ represents structure 2.

Specific examples of the basic skeleton of Formula (1) include five kinds of structures represented by the following Formulae (3) to (7), and each of them has positional isomers different in the position(s) of N atom(s) because of the difference in the condensation direction of pyridine rings. Each of them also has isomers different in substitution sites of substituent groups such as bromine.

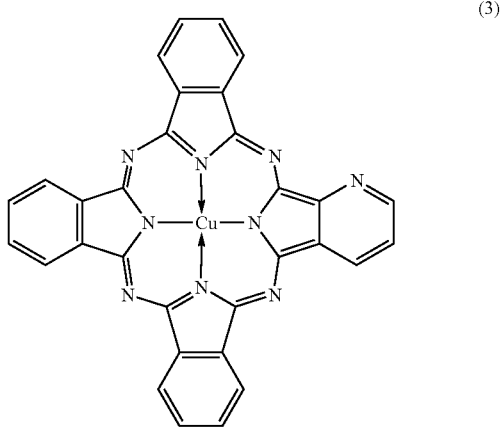

(3)

-continued

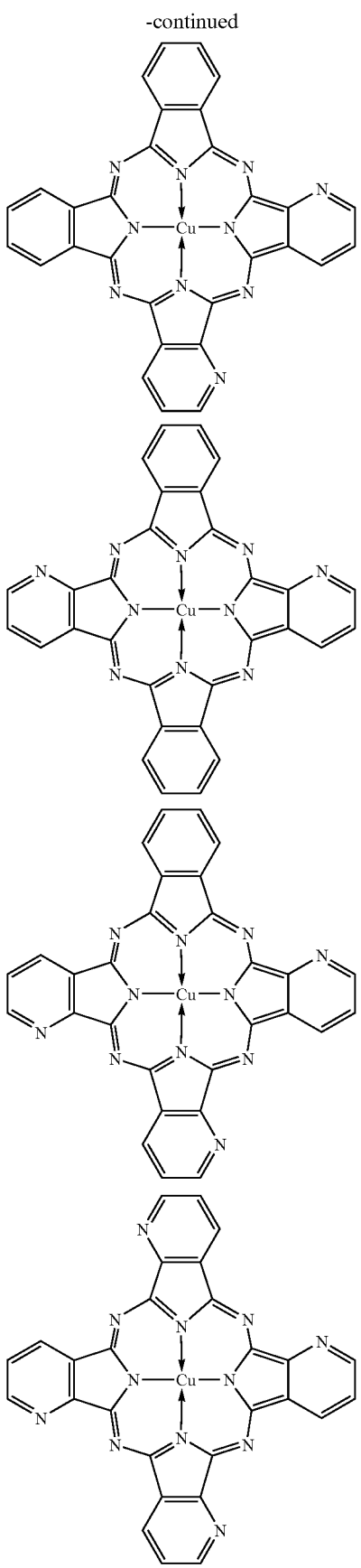

(4)

(5)

(6)

(7)

In Formula (1), $R^1$ and $R^2$ each independently represent a hydrogen atom or a substituted or unsubstituted alkyl group. However, $R^1$ and $R^2$ are not hydrogen atoms at the same time; m represents an integer of 1 to 8; and n is an integer of 1 to 4.

The unsubstituted alkyl group represented by $R^1$ or $R^2$ is preferably an alkyl group having 1 to 12 carbon atoms, and examples thereof include straight-chain or branched alkyl groups such as methyl, ethyl, n-propyl, isopropyl, n-butyl, isobutyl, n-hexyl, 2-ethylhexyl, n-octyl, and n-dodecyl groups; and, among them, straight-chain or branched alkyl groups having 4 to 12 carbon atoms are preferable.

The substituted alkyl group represented by $R^1$ or $R^2$ is preferably a substituted alkyl group having at least one oxygen atom in the form of ether, carbonyl, or ester bond; and, in particular, a straight-chain, branched, or cyclic substituted alkyl group having 2 to 12 carbon atoms and containing one to four oxygen atoms at least in one of the forms above is preferable. Examples thereof include methoxymethyl, ethoxymethyl, butoxymethyl, methoxyethyl, ethoxyethyl, 3-methoxypropyl, 3-ethoxypropyl, 3-butoxypropyl, methoxyethoxyethyl, ethoxyethoxyethyl, butoxyethoxyethyl, methoxyethoxyethoxyethyl, ethoxyethoxyethoxyethyl, butoxyethoxyethoxyethyl, acetylmethyl, acetylethyl, propionylmethyl, propionylethyl, tetrahydrofurfuryloxymethyl, 2,2-dimethyl-1,3-dioxolane-4-methoxymethyl, 2-(1,3-dioxolane)ethoxymethyl, 2-(1,3-dioxane)ethoxymethyl, methoxycarbonylmethyl, ethoxycarbonylethyl, propoxycarbonylethyl, butoxycarbonylethyl, pentoxycarbonylbutyl, 1-(butoxymethyl)ethyl, 1-(methoxymethyl)propyl, 1-(ethoxymethyl)propyl, 1-(butoxymethyl)propyl, 1-(2-methoxy-ethoxy-methyl)propyl, 1-(2-ethoxy-ethoxy-methyl)propyl, 1-(2-methoxy-2-ethoxy-2-ethoxymethyl)ethyl, 1-(2-ethoxy-2-ethoxy-2-ethoxymethyl)ethyl, 1-(2-butoxy-2-ethoxy-2-ethoxymethyl)ethyl, 1-(2-methoxy-2-ethoxy-2-ethoxymethyl)propyl, 1-(2-ethoxy-2-ethoxy-2-ethoxymethyl)propyl, 1-(2-propoxy-2-ethoxy-2-ethoxymethyl)propyl, 1-(2-butoxy-2-ethoxy-2-ethoxymethyl)propyl, 1-(2-methoxy-2-ethoxy-2-ethoxymethyl)butyl, 1-(2-ethoxy-2-ethoxy-2-ethoxymethyl)butyl, 1-(2-propoxy-2-ethoxy-2-ethoxymethyl)butyl, 1-(2-methoxy-2-ethoxy-2-ethoxymethyl)pentyl, 1-(2-ethoxy-2-ethoxy-2-ethoxymethyl)pentyl, 1-(2-methoxy-2-ethoxy-2-ethoxymethyl)ethyl, 1-(2-ethoxy-2-ethoxy-2-ethoxymethyl)ethyl, 1-(2-methoxy-2-ethoxy-2-ethoxymethyl)propyl, 1-(2-ethoxy-2-ethoxy-2-ethoxymethyl)propyl, 1-(2-methoxy-2-ethoxy-2-ethoxymethyl)butyl, 1-(2-methoxy-2-ethoxy-2-ethoxyethyl)ethyl, 1-(2-ethoxy-2-ethoxy-2-ethoxyethyl)ethyl, 1-(2-methoxy-2-ethoxy-2-ethoxyethyl)propyl, 1,1-di(methoxymethyl)methyl, 1,1-di(ethoxymethyl)methyl, 1,1-di(propoxymethyl)methyl, 1,1-di(butoxymethyl)methyl, 1,1-di(2-methoxy-ethoxymethyl)methyl, 1,1-di(2-ethoxy-ethoxymethyl)methyl, 1,1-di(2-propoxy-ethoxymethyl)methyl, and 1,1-di(2-butoxy-ethoxymethyl)methyl groups.

In a favorable embodiment, $R^1$ and $R^2$ each independently represent a hydrogen atom (wherein, $R^1$ and $R^2$ are not hydrogen atoms at the same time), an unsubstituted alkyl group, or a "substituted alkyl group containing oxygen atoms in the form of at least one of an ether, carbonyl, or ester bond".

Among them, in a particularly favorable embodiment, $R^1$ and $R^2$ each independently represent a hydrogen atom (wherein, $R^1$ and $R^2$ are not hydrogen atoms at the same time), an unsubstituted alkyl group having 1 to 12 carbon atoms, or a "substituted alkyl group having 2 to 12 carbon atoms containing one to four oxygen atoms in the form of at least one of an ether, carbonyl, or ester bond". Further preferably among them, at least one of $R^1$ and $R^2$ represents a "substituted alkyl group having 2 to 12 carbon atoms containing one to four oxygen atoms in the form of at least one of an ether, carbonyl, or ester bond", because the solubility of the compound in polar organic solvent is higher.

More preferably, at least one of $R^1$ and $R^2$ represents a substituted alkyl group having 2 to 12 carbon atoms containing one to four oxygen atoms in the form of at least one of an ether, carbonyl, or ester bond; and particularly preferable is a tetraazaporphyrin compound in which at least one of $R^1$ and $R^2$ represents a substituted alkyl group represented by the following Formula (2):

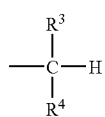

(2)

In Formula (2) above, $R^3$ and $R^4$ each independently represent a hydrogen atom, an unsubstituted alkyl group, an "alkyl group containing oxygen atoms in the form of at least one of an ether, carbonyl, or ester bond", an alkylcarbonyl group, or an alkoxycarbonyl group. However, at least one of $R^3$ and $R^4$ represents an "alkyl group containing oxygen atoms in the form of at least one of an ether, carbonyl, or ester bond", an alkylcarbonyl group, or an alkoxycarbonyl group.

The unsubstituted alkyl group represented by $R^3$ or $R^4$ is preferably an alkyl group having 1 to 8 carbon atoms, and examples thereof include methyl, ethyl, propyl, isopropyl, butyl, isobutyl, pentyl, hexyl, and octyl groups, and the like.

The "substituted alkyl group containing oxygen atoms in the form of at least one of an ether, carbonyl, or ester bond" represented by $R^3$ or $R^4$ is preferably an substituted alkyl group having 2 to 10 carbon atoms and containing one to four oxygen atoms. Examples thereof include methoxymethyl, ethoxymethyl, propoxymethyl, butoxymethyl, methoxyethoxymethyl, ethoxyethoxyethyl, propoxyethoxymethyl, butoxyethoxymethyl, methoxyethoxyethoxymethyl, ethoxyethoxyethoxymethyl, propoxyethoxyethoxymethyl, butoxyethoxyethoxymethyl, methoxyethoxyethoxyethoxymethyl, ethoxyethoxyethoxyethoxymethyl, propoxyethoxyethoxyethoxymethyl, butoxyethoxyethoxyethoxymethyl, acetylmethyl, propionylmethyl, tetrahydrofurfuryloxymethyl, 2,2-dimethyl-1,3-dioxolane-4-methoxymethyl, 2-(1,3-dioxolane)ethoxymethyl, 2-(1,3-dioxane)ethoxymethyl, methoxycarbonylmethyl, ethoxycarbonylmethyl, propoxycarbonylmethyl, butoxycarbonylmethyl, and pentoxycarbonylmethyl groups, and the like.

The alkylcarbonyl group and the alkoxycarbonyl group represented by $R^3$ or $R^4$ are each preferably an alkylcarbonyl group having 2 to 10 carbon atoms or an alkoxycarbonyl group having 2 to 10 carbon atoms. Examples thereof include acetyl, propionyl, propylcarbonyl, methoxycarbonyl, ethoxycarbonyl, propoxycarbonyl, butoxycarbonyl, and pentoxycarbonyl groups, and the like.

In Formula (1) above, m represents an integer of 1 to 8; among them, an integer of 1 to 6 is preferable; and an integer of 1 to 4 is particularly preferable, from the point of high absorbance. Alternatively, n represents an integer of 1 to 4; among them, 2 or 3 is preferable; and 2 is particularly preferable.

The tetraazaporphyrin compound represented by Formula (1) includes part or all of its multiple isomers.

Hereinafter, exemplary compounds of the tetraazaporphyrin compounds represented by Formula (1) will be shown (specific examples 1 to 157). The invention is not restricted by these specific examples.

| Example No. | Number of benzene | Number of N-pyridine | m | n | $R^1$ | $R^2$ |
|---|---|---|---|---|---|---|
| 1 | 3 | 1 | 1 | 1 | H | —$C_2H_4OC_2H_5$ |
| 2 | 3 | 1 | 2 | 2 | H | —$C_2H_4OC_2H_5$ |
| 3 | 3 | 1 | 3 | 3 | H | —$C_2H_4OC_2H_5$ |
| 4 | 3 | 1 | 1 | 4 | H | —$C_2H_4OC_2H_5$ |
| 5 | 3 | 1 | 1 | 1 | —$C_2H_4OC_2H_5$ | —$C_2H_4OC_2H_5$ |
| 6 | 3 | 1 | 1 | 1 | H | —$C_3H_6OC_4H_9$ |
| 7 | 3 | 1 | 1 | 2 | H | —$C_3H_6OC_4H_9$ |
| 8 | 3 | 1 | 1 | 3 | H | —$C_3H_6OC_4H_9$ |
| 9 | 3 | 1 | 1 | 4 | H | —$C_3H_6OC_4H_9$ |
| 10 | 3 | 1 | 1 | 1 | —$C_2H_4OCH_3$ | —$C_2H_4OCH_3$ |

-continued

| Example No. | Number of ⬡ | Number of N⬡ | m | n | R¹ | R² |
|---|---|---|---|---|---|---|
| 11 | 3 | 1 | 1 | 2 | —C₂H₄OCH₃ | —C₂H₄OCH₃ |
| 12 | 3 | 1 | 1 | 3 | —C₂H₄OCH₃ | —C₂H₄OCH₃ |
| 13 | 3 | 1 | 1 | 4 | —C₂H₄OCH₃ | —C₂H₄OCH₃ |
| 14 | 3 | 1 | 1 | 2 | —C₄H₉ | —C₄H₉ |
| 15 | 3 | 1 | 1 | 1 | H | —CH₂—CH(C₂H₅)—C₄H₉ |
| 16 | 3 | 1 | 1 | 2 | H | —CH₂—CH(C₂H₅)—C₄H₉ |
| 17 | 3 | 1 | 1 | 3 | H | —CH₂—CH(C₂H₅)—C₄H₉ |
| 18 | 3 | 1 | 1 | 4 | H | —CH₂—CH(C₂H₅)—C₄H₉ |
| 19 | 3 | 1 | 1 | 1 | H | —C₃H₆—OCH₂—CH(C₂H₅)—C₄H₉ |
| 20 | 3 | 1 | 1 | 2 | H | —C₃H₆—OCH₂—CH(C₂H₅)—C₄H₉ |
| 21 | 3 | 1 | 1 | 3 | H | —C₃H₆—OCH₂—CH(C₂H₅)—C₄H₉ |
| 22 | 3 | 1 | 4 | 2 | H | —C₃H₆—OCH₂—CH(C₂H₅)—C₄H₉ |
| 23 | 3 | 1 | 5 | 2 | H | —C₂H₄OC₂H₄OC₂H₅ |
| 24 | 3 | 1 | 6 | 1 | —C₂H₅ | —C₂H₄OC₂H₅ |
| 25 | 3 | 1 | 8 | 1 | —i-C₃H₇ | —CH₂O—C₂H₄—(1,3-dioxane) |
| 26 | 3 | 1 | 3 | 2 | H | —CH(C₂H₅)—CH₂OCH₃ |
| 27 | 3 | 1 | 1 | 1 | H | —CH(C₂H₅)—CH₂OC₂H₄OC₂H₅ |
| 28 | 3 | 1 | 1 | 2 | H | —CH(C₂H₅)—CH₂OC₂H₄OC₂H₅ |

-continued

| Example No. | Number of  | Number of  | m | n | R¹ | R² |
|---|---|---|---|---|---|---|
| 29 | 3 | 1 | 2 | 2 | H | —CH(C$_2$H$_5$)—CH$_2$OC$_2$H$_4$OC$_2$H$_5$ |
| 30 | 3 | 1 | 3 | 2 | H | —CH(C$_2$H$_5$)—CH$_2$OC$_2$H$_4$OC$_2$H$_5$ |
| 31 | 3 | 1 | 1 | 1 | H | —CH(i-C$_3$H$_7$)—COOCH$_3$ |
| 32 | 3 | 1 | 1 | 2 | H | —CH(i-C$_3$H$_7$)—COOCH$_3$ |
| 33 | 3 | 1 | 1 | 2 | H | —CH(i-C$_3$H$_7$)—COOCH$_3$ |
| 34 | 3 | 1 | 1 | 1 | H | —CH(i-C$_3$H$_7$)—COOCH$_3$ |
| 35 | 3 | 1 | 3 | 2 | —n-C$_8$H$_{17}$ | —CH(C$_2$H$_5$)—CH$_2$OC$_2$H$_4$OC$_2$H$_5$ |
| 36 | 3 | 1 | 4 | 2 | H | —CH(COOC$_2$H$_4$OC$_2$H$_5$)—COOC$_2$H$_4$OC$_2$H$_5$ |
| 37 | 3 | 1 | 1 | 1 | —C$_2$H$_4$OC$_2$H$_4$OC$_2$H$_5$ | —C$_2$H$_4$OC$_2$H$_4$OC$_2$H$_5$ |
| 38 | 2 | 2 | 1 | 1 | H | —C$_2$H$_4$OC$_2$H$_5$ |
| 39 | 2 | 2 | 1 | 2 | H | —C$_2$H$_4$OC$_2$H$_5$ |
| 40 | 2 | 2 | 1 | 3 | H | —C$_2$H$_4$OC$_2$H$_5$ |
| 41 | 2 | 2 | 1 | 4 | H | —C$_2$H$_4$OC$_2$H$_5$ |
| 42 | 2 | 2 | 1 | 2 | —C$_2$H$_4$OC$_2$H$_5$ | —C$_2$H$_4$OC$_2$H$_5$ |
| 43 | 2 | 2 | 1 | 1 | H | —C$_3$H$_6$OC$_4$H$_9$ |
| 44 | 2 | 2 | 1 | 2 | H | —C$_3$H$_6$OC$_4$H$_9$ |
| 45 | 2 | 2 | 1 | 3 | H | —C$_3$H$_6$OC$_4$H$_9$ |
| 46 | 2 | 2 | 1 | 4 | H | —C$_3$H$_6$OC$_4$H$_9$ |
| 47 | 2 | 2 | 1 | 1 | —C$_2$H$_4$OCH$_3$ | —C$_2$H$_4$OCH$_3$ |
| 48 | 2 | 2 | 1 | 2 | —C$_2$H$_4$OCH$_3$ | —C$_2$H$_4$OCH$_3$ |
| 49 | 2 | 2 | 1 | 3 | —C$_2$H$_4$OCH$_3$ | —C$_2$H$_4$OCH$_3$ |

-continued

| Example No. | Number of (benzene) | Number of N (pyridine) | m | n | R¹ | R² |
|---|---|---|---|---|---|---|
| 50 | 2 | 2 | 1 | 4 | —C₂H₄OCH₃ | —C₂H₄OCH₃ |
| 51 | 2 | 2 | 1 | 3 | —C₄H₉ | —C₄H₉ |
| 52 | 2 | 2 | 1 | 1 | H | —CH₂—CH(C₂H₅)—C₄H₉ |
| 53 | 2 | 2 | 1 | 2 | H | —CH₂—CH(C₂H₅)—C₄H₉ |
| 54 | 2 | 2 | 1 | 3 | H | —CH₂—CH(C₂H₅)—C₄H₉ |
| 55 | 2 | 2 | 1 | 4 | H | —CH₂—CH(C₂H₅)—C₄H₉ |
| 56 | 2 | 2 | 1 | 1 | H | —C₃H₆—OCH₂—CH(C₂H₅)—C₄H₉ |
| 57 | 2 | 2 | 1 | 2 | H | —C₃H₆—OCH₂—CH(C₂H₅)—C₄H₉ |
| 58 | 2 | 2 | 1 | 3 | H | —C₃H₆—OCH₂—CH(C₂H₅)—C₄H₉ |
| 59 | 2 | 2 | 1 | 4 | H | —C₃H₆—OCH₂—CH(C₂H₅)—C₄H₉ |
| 60 | 2 | 2 | 1 | 4 | H | —C₂H₄OC₂H₄OC₂H₅ |
| 61 | 2 | 2 | 1 | 1 | —C₂H₅ | —C₂H₄OC₂H₅ |
| 62 | 2 | 2 | 2 | 2 | —i-C₃H₇ | —CH₂O—C₂H₄—(1,3-dioxane) |
| 63 | 2 | 2 | 3 | 3 | H | —CH(C₂H₅)—CH₂OCH₃ |
| 64 | 2 | 2 | 1 | 1 | H | —CH(C₂H₅)—CH₂OC₂H₄OC₂H₅ |
| 65 | 2 | 2 | 1 | 2 | H | —CH(C₂H₅)—CH₂OC₂H₄OC₂H₅ |
| 66 | 2 | 2 | 3 | 3 | H | —CH(C₂H₅)—CH₂OC₂H₄OC₂H₅ |
| 67 | 2 | 2 | 1 | 4 | H | —CH(C₂H₅)—CH₂OC₂H₄OC₂H₅ |

-continued

| Example No. | Number of <br>benzene | Number of <br>N-pyridine | m | n | R¹ | R² |
|---|---|---|---|---|---|---|
| 68 | 2 | 2 | 1 | 1 | H | —CH(i-C₃H₇)—COOCH₃ |
| 69 | 2 | 2 | 2 | 2 | H | —CH(i-C₃H₇)—COOCH₃ |
| 70 | 2 | 2 | 3 | 3 | H | —CH(i-C₃H₇)—COOCH₃ |
| 71 | 2 | 2 | 1 | 4 | H | —CH(i-C₃H₇)—COOCH₃ |
| 72 | 2 | 2 | 1 | 4 | —n-C₈H₁₇ | —CH(C₂H₅)—CH₂OC₂H₄OC₂H₅ |
| 73 | 2 | 2 | 1 | 1 | H | —CH(COOC₂H₄OC₂H₅)—COOC₂H₄OC₂H₅ |
| 74 | 2 | 2 | 2 | 2 | —C₂H₄OC₂H₄OC₂H₅ | —C₂H₄OC₂H₄OC₂H₅ |
| 75 | 1 | 3 | 1 | 1 | H | —C₂H₄OC₂H₅ |
| 76 | 1 | 3 | 2 | 2 | H | —C₂H₄OC₂H₅ |
| 77 | 1 | 3 | 1 | 3 | H | —C₂H₄OC₂H₅ |
| 78 | 1 | 3 | 1 | 4 | H | —C₂H₄OC₂H₅ |
| 79 | 1 | 3 | 1 | 3 | —C₂H₄OC₂H₅ | —C₂H₄OC₂H₅ |
| 80 | 1 | 3 | 1 | 1 | H | —C₃H₆OC₄H₉ |
| 81 | 1 | 3 | 1 | 2 | H | —C₃H₆OC₄H₉ |
| 82 | 1 | 3 | 1 | 3 | H | —C₃H₆OC₄H₉ |
| 83 | 1 | 3 | 1 | 4 | H | —C₃H₆OC₄H₉ |
| 84 | 1 | 3 | 1 | 1 | —C₂H₄OCH₃ | —C₂H₄OCH₃ |
| 85 | 1 | 3 | 1 | 2 | —C₂H₄OCH₃ | —C₂H₄OCH₃ |
| 86 | 1 | 3 | 1 | 3 | —C₂H₄OCH₃ | —C₂H₄OCH₃ |
| 87 | 1 | 3 | 1 | 4 | —C₂H₄OCH₃ | —C₂H₄OCH₃ |
| 88 | 1 | 3 | 1 | 4 | —C₄H₉ | —C₄H₉ |
| 89 | 1 | 3 | 1 | 1 | H | —CH₂—CH(C₂H₅)—C₄H₉ |

-continued

| Example No. | Number of ⌬ | Number of ⌬N | m | n | R¹ | R² |
|---|---|---|---|---|---|---|
| 90 | 1 | 3 | 1 | 2 | H | —CH₂—CH(C₂H₅)—C₄H₉ |
| 91 | 1 | 3 | 1 | 3 | H | —CH₂—CH(C₂H₅)—C₄H₉ |
| 92 | 1 | 3 | 1 | 4 | H | —CH₂—CH(C₂H₅)—C₄H₉ |
| 93 | 1 | 3 | 1 | 1 | H | —C₃H₆—OCH₂—CH(C₂H₅)—C₄H₉ |
| 94 | 1 | 3 | 1 | 2 | H | —C₃H₆—OCH₂—CH(C₂H₅)—C₄H₉ |
| 95 | 1 | 3 | 1 | 3 | H | —C₃H₆—OCH₂—CH(C₂H₅)—C₄H₉ |
| 96 | 1 | 3 | 1 | 4 | H | —C₃H₆—OCH₂—CH(C₂H₅)—C₄H₉ |
| 97 | 1 | 3 | 1 | 1 | H | —C₂H₄OC₂H₄OC₂H₅ |
| 98 | 1 | 3 | 1 | 2 | —C₂H₅ | —C₂H₄OC₂H₅ |
| 99 | 1 | 3 | 3 | 3 | —i-C₃H₇ | —CH₂O—C₂H₄—(1,3-dioxane) |
| 100 | 1 | 3 | 1 | 4 | H | —CH(C₂H₅)—CH₂OCH₃ |
| 101 | 1 | 3 | 1 | 1 | H | —CH(C₂H₅)—CH₂OC₂H₄OC₂H₅ |
| 102 | 1 | 3 | 4 | 2 | H | —CH(C₂H₅)—CH₂OC₂H₄OC₂H₅ |
| 103 | 1 | 3 | 4 | 3 | H | —CH(C₂H₅)—CH₂OC₂H₄OC₂H₅ |
| 104 | 1 | 3 | 4 | 3 | H | —CH(C₂H₅)—CH₂OC₂H₄OC₂H₅ |
| 105 | 1 | 3 | 1 | 1 | H | —CH₂—C₂H₄COCH₃ |
| 106 | 1 | 3 | 2 | 2 | H | —CH₂—C₂H₄COCH₃ |
| 107 | 1 | 3 | 3 | 3 | H | —CH₂—C₂H₄COC₃H₇ |
| 108 | 1 | 3 | 1 | 4 | H | —CH₂—C₂H₄COC₃H₇ |

-continued

| Example No. | Number of ⌬ (benzene) | Number of N (pyridine) | m | n | R¹ | R² |
|---|---|---|---|---|---|---|
| 109 | 1 | 3 | 1 | 1 | —n-$C_8H_{17}$ | —CH(—$C_2H_5$)—$CH_2OC_2H_4OC_2H_5$ |
| 110 | 1 | 3 | 2 | 2 | H | —CH(—$COOC_2H_4OC_2H_5$)—$COOC_2H_4OC_2H_5$ |
| 111 | 1 | 3 | 1 | 3 | —$C_2H_4OC_2H_4OC_2H_5$ | —$C_2H_4OC_2H_4OC_2H_5$ |
| 112 | 0 | 4 | 1 | 1 | H | —$C_2H_4OC_2H_5$ |
| 113 | 0 | 4 | 1 | 2 | H | —$C_2H_4OC_2H_5$ |
| 114 | 0 | 4 | 1 | 3 | H | —$C_2H_4OC_2H_5$ |
| 115 | 0 | 4 | 1 | 4 | H | —$C_2H_4OC_2H_5$ |
| 116 | 0 | 4 | 1 | 4 | —$C_2H_4OC_2H_5$ | —$C_2H_4OC_2H_5$ |
| 117 | 0 | 4 | 1 | 1 | H | —$C_3H_6OC_4H_9$ |
| 118 | 0 | 4 | 1 | 2 | H | —$C_3H_6OC_4H_9$ |
| 119 | 0 | 4 | 1 | 3 | H | —$C_3H_6OC_4H_9$ |
| 120 | 0 | 4 | 1 | 4 | H | —$C_3H_6OC_4H_9$ |
| 121 | 0 | 4 | 1 | 1 | —$C_2H_4OCH_3$ | —$C_2H_4OCH_3$ |
| 122 | 0 | 4 | 1 | 2 | —$C_2H_4OCH_3$ | —$C_2H_4OCH_3$ |
| 123 | 0 | 4 | 1 | 3 | —$C_2H_4OCH_3$ | —$C_2H_4OCH_3$ |
| 124 | 0 | 4 | 1 | 4 | —$C_2H_4OCH_3$ | —$C_2H_4OCH_3$ |
| 125 | 0 | 4 | 1 | 1 | —$C_4H_9$ | —$C_4H_9$ |
| 126 | 0 | 4 | 1 | 1 | H | —$CH_2$—CH($C_2H_5$)—$C_4H_9$ |
| 127 | 0 | 4 | 1 | 2 | H | —$CH_2$—CH($C_2H_5$)—$C_4H_9$ |
| 128 | 0 | 4 | 1 | 3 | H | —$CH_2$—CH($C_2H_5$)—$C_4H_9$ |
| 129 | 0 | 4 | 1 | 4 | H | —$CH_2$—CH($C_2H_5$)—$C_4H_9$ |
| 130 | 0 | 4 | 1 | 1 | H | —$CHCOCH_3$ |
| 131 | 0 | 4 | 1 | 2 | H | —$CHCOCH_3$ |
| 132 | 0 | 4 | 1 | 3 | H | —$CHCOOC_3H_7$ |
| 133 | 0 | 4 | 1 | 4 | H | —$CHCOOC_3H_7$ |
| 134 | 0 | 4 | 1 | 2 | H | —$C_2H_4OC_2H_4OC_2H_5$ |
| 135 | 0 | 4 | 1 | 3 | —$C_2H_5$ | —$C_2H_4OC_2H_5$ |
| 136 | 0 | 4 | 1 | 4 | —i-$C_3H_7$ | —$CH_2O$—$C_2H_4$—(1,3-dioxane) |

-continued

| Example No. | Number of ⌬ | Number of N⌬ | m | n | R¹ | R² |
|---|---|---|---|---|---|---|
| 137 | 0 | 4 | 1 | 1 | H | —CH(C₂H₅)—CH₂OCH₃ |
| 138 | 0 | 4 | 1 | 1 | H | —CH(i-C₃H₇)—COOCH₃ |
| 139 | 0 | 4 | 1 | 2 | H | —CH(i-C₃H₇)—COOCH₃ |
| 140 | 0 | 4 | 1 | 3 | H | —CH(i-C₃H₇)—COOCH₃ |
| 141 | 0 | 4 | 1 | 4 | H | —CH(i-C₃H₇)—COOCH₃ |
| 142 | 0 | 4 | 1 | 1 | H | —CH(i-C₃H₇)—COOCH₃ |
| 143 | 0 | 4 | 1 | 2 | H | —CH(i-C₃H₇)—COOCH₃ |
| 144 | 0 | 4 | 1 | 3 | H | —CH(i-C₃H₇)—COOCH₃ |
| 145 | 0 | 4 | 1 | 4 | H | —CH(i-C₃H₇)—COOCH₃ |
| 146 | 0 | 4 | 1 | 2 | —n-C₈H₁₇ | —CH(C₂H₅)—CH₂OC₂H₄OC₂H₅ |
| 147 | 0 | 4 | 1 | 3 | H | —CH(COOC₂H₄OC₂H₅)—COOC₂H₄OC₂H₅ |
| 148 | 0 | 4 | 1 | 4 | —C₂H₄OC₂H₄OC₂H₅ | —C₂H₄OC₂H₄OC₂H₅ |
| 149 | 3 | 1 | 1 | 4 | —C₁₀H₂₁ | H |
| 150 | 3 | 1 | 1 | 3 | —C₁₂H₂₅ | —C₁₂H₂₅ |
| 151 | 3 | 1 | 1 | 4 | —C₁₂H₂₅ | —C₂H₄OC₂H₅ |
| 152 | 3 | 1 | 1 | 1 | —CH(C₂H₅)CH₂OC₂H₄OC₂H₄OCH₃ | H |
| 153 | 3 | 1 | 1 | 3 | —CH(C₂H₅)CH₂OC₂H₄OC₂H₄OC₂H₅ | —C₂H₅ |
| 154 | 3 | 1 | 1 | 1 | —CH(C₄H₉)CH₂OC₂H₄OC₂H₄OC₂H₅ | H |

-continued

| Example No. | Number of 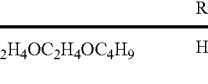 | Number of  | m | n | R¹ | R² |
|---|---|---|---|---|---|---|
| 155 | 3 | 1 | 1 | 1 | —CH(C₂H₅)CH₂OC₂H₄OC₂H₄OC₄H₉ | H |
| 156 | 3 | 1 | 1 | 2 | —CH(C₂H₅)CH₂OC₂H₄OC₂H₄OC₂H₄OCH₃ | H |
| 157 | 3 | 1 | 1 | 3 | —CH(C₂H₅)CH₂OC₂H₄OC₂H₄OC₂H₄OC₂H₅ | H |

—Method of Producing Tetraazaporphyrin Compound Represented by Formula (1)—

Hereinafter, the method of producing the tetraazaporphyrin compound represented by Formula 1 will be described. Its representative production method is briefly as follows:

(1) The basic skeleton of a bromo-substituted tetraazaporphyrin compound is prepared in reaction of a mixture of acids properly selected from the group consisting of phthalic acid, bromo-substituted phthalic acids, pyridine-2,3-dicarboxylic acid, and bromo-substituted pyridine-2,3-dicarboxylic acids;

(2) Then, it is chlorosulfonylated; and (3) The chlorosulfonylated bromo-substituted tetraazaporphyrin obtained is further amidated in reaction with an amine.

In another synthesis method, it can also be synthesized, for example, by allowing a mixture of phthalic acid and pyridine-2,3-dicarboxylic acid to react to give a tetraazaporphyrin compound and chlorosulfonylating, amidating and then brominating it, or by brominating, chlorosulfonylating and amidating the tetraazaporphyrin compound.

Hereinafter, the synthesis method above will be described in more detail.

The step (1) is a step of forming a bromo-substituted tetraazaporphyrin ring, in which the tetraazaporphyrin ring is prepared by allowing a mixture of acids properly selected from, the group consisting of phthalic acid, bromo-substituted phthalic acids, pyridine-2,3-dicarboxylic acid, and bromo-substituted pyridine-2,3-dicarboxylic acids and copper powder, copper oxide or a copper salt to react in the presence of ammonia gas or an ammonium compound, or urea in no solvent or in a solvent such as tetralin, 1-chloronaphthalene, nitrobenzene, trichlorobenzene, or DMI at 120 to 300° C., by using ammonium molybdenate salt or the like as a catalyst.

As for the ratios (molar ratios) of the respective components in the mixture of phthalic acid (A), a bromo-substituted phthalic acid (B), pyridine-2,3-dicarboxylic acid (C), and a bromo-substituted pyridine-2,3-dicarboxylic acid (D) for use in the ling-forming method.

(A)+(B):(C)+(D) is preferably in the range of 3.5:0.5 to 0:4, more preferably in the range of 3:1 to 0.5:3.5, and still more preferably in the range of 3:1 to 1:3; and (A)+(C):(B)+(D) is preferably in the range of 3.5:0.5 to 0:4, more preferable in the range of 3:1 to 0.5:3.5, and still more preferably in the range of 3:1 to 1:3.

Phthalic acid, the bromo-substituted phthalic acid, pyridine-2,3-dicarboxylic acid, and the bromo-substituted pyridine-2,3-dicarboxylic acid may be replaced with their respective dicyano derivatives or acid anhydrides.

Specific examples of the bromo-substituted phthalic acids include, 3-bromophthalic acid, 4-bromophthalic acid, 3,4,5,6-tetrabromophthalic acid, and the like. Specific examples of the bromo-substituted pyridine-2,3-dicarboxylic acids include, 5-bromopyridine-2,3-dicarboxylic acid, 6-bromopyridine-2,3-dicarboxylic acid, and the like.

The step (2) is a chlorosulfonylation step of chlorosulfonylating the bromo-substituted tetraazaporphyrin compound above, and the bromo-substituted tetraazaporphyrin compound obtained in the step (1) is added gradually into chlorosulfonic acid in an amount 5 to 20 times larger by mass, while keeping the temperature at 20° C. or lower. The mixture is allowed to react at the same temperature for 1 hour, and at 155 to 160° C. for 4 hours. To the mixture previously cooled to 80° C., added is thionyl chloride in an amount 2 to 5 times larger by mass than that of the tetraazaporphyrin compound over 1 to 2 hours, while the mixture is kept at 70 to 80° C. The mixture is stirred at the same temperature additionally for 2 to 10 hours, cooled to 15 to 20° C., and stirred at the same temperature additionally for 12 hours. The reaction solution is poured gradually into ice water in an amount of 50 to 200 times larger by mass than that of chlorosulfonic acid used, and the precipitate is filtered and washed with ice waster until pH becomes neutral, to give a sulfonyl chloride derivative of the bromo-substituted tetraazaporphyrin compound.

The reaction condition is a condition favorable for obtaining mainly tetrasulfonyl chloride; and mono-, di- or ti-substituted sulfonyl chloride can be obtained by making the reaction condition in chlorosulfonic acid milder. That is, these compounds can be prepared by lowering the reaction temperature or shortening the reaction time.

The step (3) is a sulfonamidation step of amidating the sulfonyl chloride, and the sulfonyl chloride derivative of the bromo-substituted tetraazaporphyrin compound obtained in the step (2) is suspended in ice water, and an organic amine compound represented by NHR¹R² (wherein, R¹ and R² have the same meanings as R¹ and R² in Formula (1) above) (at a molar ratio of 2 to 8 times larger than the bromo-substituted tetraazaporphyrin compound) is added dropwise, while the solution is kept at 15° C. or lower. After dropwise addition, the mixture is stirred at 20 to 30° C. for 15 to 24 hours, and the precipitate is filtered, washed with water, and dried, to give a tetraazaporphyrin compound represented by Formula 1.

The product thus obtained is often a mixture of the multiple isomers described above, but such a mixture is also included in the scope of the invention and shows the same advantageous effects of the invention.

When the product is a mixture, it is possible to purify it, as needed, by common purification methods, for example, by recrystallization with an organic solvent such as ethyl acetate, acetone, or methanol and by column chromatography, and to obtain an isolated compound.

The compounds (colorants) represented by Formula (1) above may be used in combination of two or more, and in combination with another colorant, a metal or nitrogen-containing compound salt or complex of another colorant, a derivative of another colorant, or the like.

Examples of the other colorants include the known colorants, such as direct dyes, acidic dyes, mordant-acidic mordant dyes, basic dyes, vat dyes, sulfide dyes, azoic dyes, disperse dyes, reaction dyes, fluorescent brightener, other dyes, pigment resin color, and pigments, near-infrared absorption colorants, such as described in COLOUR INDEX (SOCIETY OF DYES AND COLOURISTS) and Dyeing Note (published by Shikisensha Co., Ltd.), and the like.

Examples of these colorants include C.I. Solvent Blue 25, C.I. Solvent Blue 55, C.I, Solvent Blue 67, C.I. Solvent Blue 38, C.I. Solvent Yellow 82, C.I. Solvent Yellow 162, C.I, Solvent Orange 56, C.I. Acid Violet 17, C.I. Acid Violet 49, C.I. Direct Blue 86, and the like; and these colorants way be used alone or in combination of two or more.

—Acidic Dye—

The acidic dye is not particularly limited as long as it contains an acidic group such as sulfonic acid or carboxylic acid, and is selected, taking into consideration all of desirable properties such as solubility in organic solvent or developers, salt-forming property, absorbance, hardening property, interaction with other components in the curable composition, light resistance, and heat resistance.

Hereinafter, specific examples of the acidic dyes are listed. However, the invention is not limited thereto.

Acid Alizarin Violet N:

Acid Black 1, 2, 24, and 48;

Acid Blue 1, 7, 9, 15, 18, 23, 25, 27, 29, 40, 45, 62, 70, 74, 80, 83, 86, 87, 90, 92, 103, 108, 112, 113, 120, 129, 138, 147, 158, 171, 182, 192, and 249;

Acid Chrome Violet K:

Acid Fuchsin:

Acid Green 1, 3, 5, 9, 16, 25, 27, and 50;

Acid Orange 6, 7, 8, 10, 12, 50, 51, 52, 56, 63, 74, and 95;

Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;

Acid Violet 6B, 7, 9, 17, and 19;

Acid Yellow 1, 3, 7, 9, 11, 17, 23, 25, 29, 34, 36, 40, 42, 54, 65, 72, 73, 76, 79, 98, 99, 111, 112, 114, 116, 163, and 243;

Food Yellow 3; and the derivatives of these dyes.

Among these acidic dyes, favorable are dyes such as Acid Black 24;

Acid Blue 7, 23, 25, 29, 62, 83, 86, 87, 90, 92, 108, 138, 158, and 249:

Acid Green 3, 5, 9, 16, 25, 27, and 50;

Acid Orange 8, 51, 56, 63, and 74;

Acid Red 1, 4, 8, 34, 37, 42, 52, 57, 80, 97, 114, 143, 145, 151, 183, and 217;

Acid Violet 7; and

Acid Yellow 17, 23, 25, 29, 34, 40, 42, 72, 76, 99, 111, 112, 114, 116, 163, and 243;

and the derivatives of these dyes.

In addition to the dyes above, azo-, xanthene-, and phthalocyanine-based acidic dyes are also preferable, and examples thereof include acidic dyes such as C.I. Solvent Blue 44 and 38, C.I. Solvent Orange 45, Rhodamine B, Rhodamine 110, and 3-[(5-chloro-2-phenoxyphenyl)hydrazono]-3,4-dihydro-4-oxo-5-[(phenylsulfonyl)amino]-2,7-naphthalenedisulfonic acid, and the derivatives of these dyes. Favorable examples of the acidic dye derivatives include sulfonic amides, sulfonic esters, and others of the acidic dyes.

—Atom Group Forming Salt with Acidic Dye—

The atom group forming a salt with the acidic dye is not particularly limited as long as it is cationic and forms a salt with the anion of the acidic dye. Examples of the atom groups include cations such as of Li, Na, K, Rb, Cs, Ag, Mg, Ca, Sr, Ba, Zn, Al, Ni, Cu, Co, Fe, or nitrogen-containing compounds, and the like. The nitrogen-containing compounds forming a salt with the acidic dye will be described below.

The nitrogen-containing compound forming a salt with the acidic dye is selected, taking into consideration all of properties such as solubility in the organic solvent or developer, salt forming property, dye absorbance, interaction with other components in the curable composition, and others. If selected only from the viewpoint of absorbance, the nitrogen-containing compound preferably has a lower molecular weight, and specifically, among these, a nitrogen-containing compound having a molecular weight of 245 or less is preferable; a nitrogen-containing compound having a molecular weight of 240 or less is more preferable; and a nitrogen-containing compound having a molecular weight of 230 or less is particularly preferable.

In addition, a nitrogen-containing compound generally known as discoloration inhibitor may be used for prevention of photodiscoloration of the dye and improvement in heat resistance, and, from this viewpoint, compound having a lower oxidation potential (i.e., a smaller ionization potential), tertiary amine compounds, cyclic aliphatic amine compounds, aniline compounds, hydrazine compounds, and the like are preferable.

—Molar Ratio of Salt-Forming Atom Group to Acidic Dye—

The molar ratio, salt-forming atom group/acidic dye, (hereinafter, abbreviated as "L"), is a molar ratio of the acidic dye molecule to the counter-ion atom group, and may be selected arbitrarily, according to the salt-forming condition for the acidic dye atom group. Specifically, L is a number in the range of $0<L\leq10$, and is selected, taking into consideration the priority among desirable properties such as solubility in the organic solvent or developer, salt forming property, absorbance, interaction with other components in the curable composition, light resistance, and heat resistance. If selected only from the viewpoint of absorbance or color value, L is preferably in the range of $0<L\leq7$, more preferable $0<L\leq6$, and particularly preferably $0<L\leq5$.

When the concentration of the compound represented by Formula (1) above in the colorant-containing curable composition (when another dye such as acidic dye is used in combination, the concentration of the other dye (in particular, acidic dye) is also included) varies according to the kind of the colorant (in particular, dye) used, but is preferably 0.5 to 80 wt %, more preferably 0.5 to 60 wt %, and particularly preferably 0.5 to 50 wt %, with respect to the total solid matters in the composition.

<Binder>

The colorant-containing curable composition according to the invention may favorably contain at least one binder. The binder for use in the invention is not particularly limited as long as it is alkali-soluble, and preferably selected from the viewpoints of heat resistance, developing property, availability, and others.

The alkali-soluble binder is preferably a linear organic polymer that is soluble in organic solvents and can be developed with a weakly alkaline aqueous solution. Examples of the linear organic polymers include polymers having a carboxylic acid on the side chain such as the methacrylic acid copolymers, acrylic acid copolymers, itaconic acid copolymers, crotonic acid copolymers, maleic acid copolymers, partially-esterified maleic acid copolymers, and others described in JP-A No. 59-44615, Japanese Patent Application Publication (JP-B) Nos. 54-34327, 58-12577, and 54-25957, and JP-A Nos. 59-53836 and 59-71048; and also, acidic cellulose derivatives having a carboxylic acid on the side chain are useful. Acid anhydride adducts of hydroxyl group-containing polymers, polyhydroxystyrene resins, polysiloxane resins, poly(2-hydroxyethyl(meth)acrylate), polyvinylpyrrolidone, polyethyleneoxide, polyvinylalcohol, and others are also useful.

The alkali-soluble binder may be a copolymer of a hydrophilic monomer, and examples thereof include alkoxyalkyl (meth)acrylates, hydroxyalkyl(meth)acrylates, glycerol (meth)acrylate, (meth)acrylamide, N-methylol acrylamide, secondary or tertiary alkylacrylamides, dialkylaminoalkyl (meth)acrylates, morpholine(meth)acrylate, N-vinylpyrrolidone, N-vinylcaprolactam, vinylimidazole, vinyltriazole, methyl(meth)acrylate, ethyl(meth)acrylate, branched or straight-chain propyl(meth)acrylate, branched or straight-chain butyl(meth)acrylate, phenoxyhydroxypropyl(meth)acrylate, and the like.

In addition, monomers containing a tetrahydrofurfuryl group, a phosphoric moiety, a phosphoric ester moiety, a quaternary ammonium salt moiety, an ethyleneoxy chain, a propyleneoxy chain, or a moiety of sulfonic acid or a salt thereof, a morpholinoethyl group, or the like are also useful as the hydrophilic group-containing monomers.

The monomer may have a polymerizable group on the side chain for improvement in crosslinking property, and for example, polymers having an allyl, (meth)acryl, allyloxyalkyl or similar group on the side chain as the polymerizable group are also useful. Examples of these polymerizable group-containing polymers will be shown below, but the polymer is not limited thereto as long as it contains an alkali-soluble group such as COOH, OH, or ammonium and a carbon-carbon unsaturated bond.

Specific examples thereof for use include compounds obtained by reacting a copolymer of an OH group-containing monomer such as 2-hydroxyethyl acrylate, a COOH group-containing monomer such as methacrylic acid, and a monomer of acrylic, vinyl, or other compound copolymerizable therewith with a compound containing an epoxy ring reactive with the OH group and a carbon-carbon unsaturated bond group (e.g., compound such as glycidyl acrylate), and the like.

In addition to the epoxy ring above, compounds containing an acid anhydride, isocyanate, or acryloyl group as the group reactive with the OH group can be used. The reaction products described in JP-A No. 6-102669 or 6-1938, which are prepared by reacting a compound obtained in reaction of an epoxy ring-containing compound and an unsaturated carboxylic acid such as acrylic acid with a saturated or unsaturated polybasic acid anhydride, may also be used.

Examples of the compounds having both an alkali solubilizing group such as COOH and a carbon-carbon unsaturated group include DIANAL NR series products (manufactured by Mitsubishi Rayon Co., Ltd.); PHOTOMER 6173 (COOH group-containing Polyurethane acrylic oligomer, manufactured by Diamond Shamrock Co. Ltd.); VISCOAT R-264 and KS RESIST 106 (each of them is manufactured by Osaka Organic Chemical Industry Ltd.); CYCLOMER P and PLACCEL CF200 series products (manufactured by Daicel Chemical Industries, Ltd.); EBECRY 13800 (manufactured by Daicel UCB Co., Ltd.); and the like.

Among these various binders, the alkali-soluble binder for use in the invention is preferably a polyhydroxystyrene resin, a polysiloxane resin, an acrylic resin, an acrylamide resin, or an acryl/acrylamide copolymer resin, more preferably an acrylic, polyhydroxystyrene, or polysiloxane resin, from the viewpoint of heat resistance. In addition, acrylic resins, acrylamide resins, and acryl/acrylamide copolymer resins are preferable from the viewpoint of control of developing property.

Favorable examples of the acrylic resins include copolymers of monomers selected from benzyl(meth)acrylate, (meth)acrylic acid, hydroxyethyl(meth)acrylate, (meta)acrylamide, and others; (meth)acrylic resins having a polymerizable side chain such as CYCLOMER P and PLACCEL CF200 series products (manufactured by Daicel Chemical Industries, Ltd.), EBECRY 13800 (manufactured by Daicel UCB Co., Ltd.), DIANAL NR series products (Mitsubishi Rayon Co., Ltd.), VISCOAT R264 and KS Resist 106 (manufactured by Osaka Organic Chemical Industry Ltd. Co., Ltd.); and the like.

Alcohol-soluble nylons, polyethers of 2,2-bis-(4-hydroxyphenyl)-propane and epichlorohydrin, and others are also useful, for improvement in the strength of hardened film.

Alternatively, an alkali-soluble phenol resin may also be used. The alkali-soluble phenol resin is favorable, when the composition according to the invention is used as a positive composition. Examples of the alkali-soluble phenol resins include novolak resins, vinyl polymers, and the like.

Examples of the novolak resins include those obtained by condensation of a phenol and an aldehyde in the presence of an acid catalyst. Examples of the phenols include phenol, cresol, ethylphenol, butylphenol, xylenol, phenylphenol catechol, resorcinol pyrogallol, naphthol, bisphenol A, and the like, and these phenols may be used alone or in combination of two or more. Examples of the aldehydes include formaldehyde, paraformaldehyde, acetaldehyde, propionaldehyde, benzaldehyde, and the like.

Specific examples of the novolak resins include condensation products between meta-cresol, para-cresol, or the mixture thereof and formalin. The molecular weight distribution of the novolak resin may be adjusted, for example, by means of fractionation. In addition, a phenolic hydroxyl group-containing low-molecular weight component such as bisphenol C or bisphenol A may be added to the novolak resin.

The binder according to the invention is preferably a polymer having a weight-average molecular weight (as polystyrene equivalent molecular weight, as determined by GPC) of 1,000 to $2\times10^5$, more preferably 2,000 to $1\times10^5$, and particularly preferably, 3,000 to $5\times10^4$.

The content of the binder, if used, in the composition according to the invention is preferably 10 to 90 wt %, more preferably 20 to 80 wt %, and particularly preferably 30 to 70 wt %, with respect to the total solid matters in the composition.

<Crosslinking Agent>

In the invention, the compound represented by Formula (1) described above is contained as a colorant, and thus the light resistance, heat resistance, and pattern-forming property are improved compared to the conventional techniques, and a favorably hardened film can be obtained by effective curing reaction of the film; but it is also possible to obtain a further highly hardened film, by adding a crosslinking agent additionally.

The crosslinking agent is not particularly limited as long as it can harden films in crosslinking reaction, and examples thereof include (a) epoxy resins; (b) melamine, guanamine, glycoluril, and urea compounds substituted by at least one group selected from methylol, alkoxymethyl, and acyloxymethyl groups; and (c) phenol, naphthol, and hydroxyanthracene compounds substituted by at least one group selected from methylol, alkoxymethyl, and acyloxymethyl groups. Among them, multifunctional epoxy resins are particularly preferable.

The epoxy resin (a) is not particularly limited as long as it contains an epoxy group and is crosslinking property, and examples thereof include bivalent glycidyl group-containing low-molecular weight compounds such as bisphenol A glycidyl ether, ethylene glycol diglycidyl ether, butanediol diglycidyl ether, hexanediol diglycidyl ether, dihydroxybiphenyl diglycidyl ether, phthalic diglycidyl ester, and N,N-diglycidylaniline; trivalent glycidyl group-containing low-molecular weight compounds represented by trimethylolpropane triglycidyl ether, trimethylol phenol triglycidyl ether, and TrisP-PA triglycidyl ether, quadrivalent glycidyl group-containing low-molecular weight compounds represented by pentaerythritol tetraglycidyl ether, and tetramethylol bisphenol A tetraglycidyl ether, multivalent glycidyl group-containing low-molecular weight compounds represented by dipentaerythritol pentaglycidyl ether and dipentaerythritol hexaglycidyl ether; glycidyl group-containing polymeric compounds such as polyglycidyl(meth)acrylate and 1,2-epoxy-4-(2-oxiranyl)cyclohexane adducts of 2,2-bis(hydroxymethyl)-1-butanol; and the like.

The number of methylol, alkoxymethyl, and acyloxymethyl groups contained as substituent groups in the crosslinking agent (b) is from 2 to 6 when it is a melamine compound, and is from 2 to 4 when it is a glycoluril, guanamine, or urea compound, but is preferably from 5 to 6 when it is a melamine compound, and is preferably from 3 to 4 when it is a glycoluril, guanamine, or urea compound.

Hereinafter, the melamine compound, guanamine compound, glycoluril compound and urea compound described in item (b) above is collectively referred to as compounds of item (b) (methylol group-containing compounds, alkoxymethyl group-containing compounds, or acyloxymethyl group-containing compounds) in some cases.

The methylol group-containing compound of item (b) is prepared by heating an alkoxymethyl group-containing compound of item (b) in alcohol in the presence of an acid catalyst such as hydrochloric acid, sulfuric acid, nitric acid, or methanesulfonic acid. The acyloxymethyl group-containing compound of item (b) is prepared by mixing and stirring a methylol group-containing compound of item (b) with an acyl chloride in the presence of a basic catalyst.

Hereinafter, specific examples of the compounds of item (b) having substituents as described above will be listed.

Examples of the melamine compounds include hexamethylolmelamine, hexamethoxymethylmelamine, compounds obtained by methoxymethylating 1 to 5 methylol groups of hexamethylolmelamine and mixtures thereof, hexamethoxyethylmelamine, hexacyloxymethylmelamine, and compounds obtained by acyloxymethylating 1 to 5 methylol groups of hexamethylolmelamine and mixtures thereof.

Examples of the guanamine compounds include tetramethylolguanamine, tetramethoxymethylguanamine, compounds obtained by methoxymethylating 1 to 3 methylol groups of tetramethylolguanamine and mixtures thereof, tetramethoxymethylguanamine, tetraacyloxymethylguanamine, compounds obtained by acyloxymethylating 1 to 3 methylol groups of tetramethylolguanamine and mixtures thereof.

Examples of the glycoluril compounds include tetramethylol glycoluril, tetramethoxymethyl glycoluril, compounds obtained by methoxymethylating 1 to 3 methylol groups of tetramethylol glycoluril and mixtures thereof, and compounds obtained by acyloxymethylating 1 to 3 methylol groups of tetramethylol glycoluril and mixtures thereof.

Examples of the urea compounds include tetramethylolurea, tetramethoxymethylurea, compounds obtained by methoxymethylating 1 to 3 methylol groups of tetramethylolurea and mixtures thereof, and tetramethoxymethylurea.

Only one compound of item (b) may be used, or a plurality of compounds of item (b) may be used in combination.

The crosslinking agent (c), i.e., the phenol, naphthol, or hydroxyanthracene compound substituted by at least one group selected from methylol, alkoxymethyl, and acyloxymethyl groups, prevents intermixing with the topcoat photoresist and improves the strength of the film further by thermal crosslinking in a similar manner to the crosslinking agent (b) above.

Hereinafter, these compounds may be referred to collectively as compounds of item (c) (methylol group-containing compounds, alkoxymethyl group-containing compounds, and acyloxymethyl group-containing compounds).

The number of the methylol, acyloxymethyl, and alkoxymethyl groups contained in the crosslinking agent (c) is at least two per molecule, and compounds having a skeletal phenol compound substituted at all 2- and 4-sites are preferable, from the viewpoints of thermal crosslinking property and storage stability. In addition, the skeletal naphthol or hydroxyanthracene compound is also preferably a compound having substituents at all ortho- and para-positions relative to the OH group. The 3- or 5-position of the skeletal phenol compound may be unsubstituted or substituted. In addition, in the skeletal naphthol compound, the positions other than ortho-positions relative to the OH group may be unsubstituted or substituted.

The methylol group-containing compound of item (c) is prepared by by using a compound having hydrogen atoms at the ortho- and para-positions (2- or 4-sites) to the phenolic OH group as raw material and reacting it with formalin in the presence of a basic catalyst such as sodium hydroxide, potassium hydroxide, ammonia, or a tetraalkylammonium hydroxide.

The alkoxymethyl group-containing compound of item (c) is prepared by heating a methylol group-containing compound of item (c) in alcohol in the presence of an acid catalyst such as hydrochloric acid, sulfuric acid, nitric acid, or methanesulfonic acid.

The acyloxymethyl group-containing compound of item (c) is prepared by reacting a methylol group-containing compound of item (c) with an acyl chloride in the presence of a basic catalyst.

Examples of the skeletal compounds for the crosslinking agent (c) include phenol, naphthol, and hydroxyanthracene compounds having no substituent on the ortho- and para-positions relative to the phenolic OH group, and specific examples thereof for use include phenol, cresol isomers, 2,3-xylenol, 2,5-xylenol, 3,4-xylenol, 3,5-xylenol, bisphenols such as bisphenol A, 4,4'-bishydroxybiphenyl, TrisP-PA (manufactured by Honshu Chemical Industry Co., Ltd.), naphthol, dihydroxynaphthalene, 2,7-dihydroxyanthracene, and the like.

Specific examples of the crosslinking agent (c) include trimethylol phenol, tri(methoxymethyl)phenol, compounds obtained by methoxymethylating 1 or 2 methylol groups of trimethylol phenol, trimethylol-3-cresol, tri(methoxymethyl)-3-cresol, compounds obtained by methoxymethylating 1 or 2 methylol groups of trimethylol-3-cresol, dimethylol cresol such as 2,6-dimethylol-4-cresol, tetramethylol bisphenol A, tetamethoxymethylbisphenol A, compounds obtained by methoxymethylating 1 to 3 methylol groups of tetramethylol bisphenol A, tetramethylol-4,4'-bishydroxybiphenyl, tetramethoxymethyl-4,4'-bishydroxybiphenyl, TrisP-PA in form of hexamethylol, hexamethoxymethylated TrisP-PA, compounds obtained by methoxymethylating 1 to 5 methylol groups of hexamethylol body of TrisP-PA, and bishydroxymethylnaphthalenediol.

Further examples include hydroxyanthracene compounds such as 1,6-dihydroxymethyl-2,7-dihydroxyanthracene, and acyloxymethyl-containing compounds such as compounds obtained by acyloxymethylating some or all of the methylol groups of the above-mentioned methylol-containing compounds.

Preferable examples of those compounds include trimethylol phenol, bishydroxymethyl-p-cresol, tetramethylol bisphenol A, hexamethylol body of TrisP-PA (manufactured by Honshu Kagaku Kogyo Co., Ltd.), or phenol compounds obtained by substituting some or all of the methylol groups of these compounds with alkoxymethyl groups or with methylol group(s) and alkoxymethyl group(s). Only one compound of item (c) may be used, or a plurality of compounds of item (c) may be used in combination.

The content of the crosslinking agents (a) to (c), if used, in the colorant-containing curable composition may vary according to the raw materials used, but is preferably from 1 to 70 wt %, more preferably fiom 5 to 50 wt %, and particularly preferably fron 7 to 30 wt %, with respect the total solid matters (by weight) in the composition. A content in the range above leads to preservation of favorable hardening degree and solubilization property in the unexposed area, and prevents drastic deterioration in hardening degree in the exposed area or solubility of the unexposed portion.

<Polymerizable Compound>

The colorant-containing curable composition according to the invention, when used as a negative composition, may contain favorably a polymerizable compound (hereinafter, referred to as "monomer").

The monomer is preferably a compound having a boiling point of 100° C. or higher under atmospheric pressure and containing at least one addition-polymerizable ethylenic unsaturated group compound. The ethylenic unsaturated group is particularly preferably a (meth)acryloyl group. The term (meth)acryloyl means acryloyl or methacryloyl, and the following (meth)acrylate means acrylate or methacrylate similarly.

Examples of the monomers include monofunctional acrylates and methacrylates such as polyethylene glycol mono(meth)acrylate, polypropylene glycol mono(meth)acrylate, and phenoxyethyl(meth)acrylate; polyfunctional acrylates and methacrylates such as polyethylene glycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, multifunctional alcohols (such as glycerol or trimethylolethane) ethyleneoxide or propyleneoxide adducts that are (meth)acrylated, the urethane acrylates such as those described in JP-B Nos. 48-41708 and 50-6034, and JP-A No. 51-37193, the polyester acrylates such as those described in JP-A No. 48-64183, and JP-8 Nos. 49-43191 and 52-30490, and epoxy acrylates, i.e., reaction products of an epoxy resin and a (meth)acrylic acid; and mixture of monomers selected from the above; and the like. Also included are the photohardening monomers and oligomers described in the Journal published by Adhesion Society of Japan Vol. 20, No. 7, pp 300 to 308.

The monomer is preferably a (meth)acrylic ester-based monomer; and a trifunctional or higher-functional (meth)acrylic ester-based monomer is particularly preferable.

The content of the monomer in the colorant-containing curable composition according to the invention is preferably 0.1 to 90 wt %, more preferably 1.0 to 80 wt %, and particularly preferably 2.0 to 70 wt %, with respect to the solid matter in the composition.

<Photopolymerization Initiator>

When used as a negative composition, the colorant-containing curable composition according to the invention may preferably contain at least one photopolymerization initiator, in addition to the polymerizable compound (monomer) above.

The photopolymerization initiator is not particularly limited as long as it can polymerize the monomer, and is selected preferably from the viewpoints of initiation efficiency, absorption wavelength, availability, cost, and others.

Examples of the photopolymerization initiators include trihalomethyl-s-triazine compounds, benzyldimethyl ketal compounds, α-hydroxyketone compounds, α-aminoketone compounds, phosphine oxide compounds, metallocene compounds, oxime compounds, triallylimidazole dimer, benzothiazole compounds, benzophenone compounds, acetophenone compounds and the derivatives thereof, cyclopentadiene-benzene-iron complexes and salts thereof, halomethyloxadiazole compounds, 3-aryl-substituted coumarine compounds, and the like; and the photopolymerization initiator is preferably at least one compound selected from the group consisting of α-aminoketone compounds, phosphine oxide compounds, metallocene compounds, oxime compounds, and triallylimidazole dimer.

A compound that does not generate an acid by decomposition is preferably selected as the photopolymerization initiator according to the invention, from the viewpoints of light resistance and heat resistance of the colorant (in particular, dye).

Examples of the reactive halogen compounds such as the halomethyloxadiazole compounds include the 2-halomethyl-5-vinyl-1,3,4-oxadiazole compounds and others such as described in JP-B No. 57-6096; 2-trichloromethyl-5-styryl-1,3,4-oxadiazole, 2-trichloromethyl-5-(p-cyanostyryl)-1,3,4-oxadiazole, 2-trichloromethyl-5-(p-methoxy styryl)-1,3,4-oxadiazole, and the like.

Examples of the trihalomethyl-s-triazine compounds include the vinyl-halomethyl-s-triazine compounds such as described in JP-B No. 59-1281, the 2-(naphtho-1-yl)-4,6-bis-halomethyl-s-triazine compounds such as described in JP-A No. 53-133428; and 4-(p-aminophenyl)-2,6-di-halomethyl-s-triazine compounds.

Other examples thereof include
2,4-bis(trichloromethyl)-6-p-methylstyryl-s-triazine,
2,6-bis(trichloromethyl)-4-(3,4-methylenedioxyphenyl)-1,3,5-triazine,
2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine,
2-trichloromethyl-4-amino-6-p-methylstyryl-s-triazine,
2-(naphtho-1-yl)-4,6-bistrichloromethyl-s-triazine,
2-(4-methoxy-naphtho-1-yl)-4,6-bis-trichloromethyl-s-triazine,
2-(4-ethoxy-naphtho-1-yl)-4,6-bis-trichloromethyl-s-triazine,
2-(4-butoxy-naphtho-1-yl)-4,6-bis-trichloromethyl-s-triazine,
2-[4-(2-methoxyethyl)-naphtho-1-yl]4,6-bis-trichloromethyl-s-triazine,
2-[4-(2-ethoxyethyl)-naphtho-1-yl]-4,6-bis-trichloromethyl-s-triazine,
2-[4-(2-butoxyethyl)-naphtho-1-yl]-4,6-bis-trichloromethyl-s-triazine,
2-(2-methoxy-naphtho-1-yl)-4,6-bis-trichloromethyl-s-triazine,
2-(6-methoxy-5-methyl-naphtho-2-yl)-4,6-bis-trichloromethyl-s-triazine,
2-(6-methoxy-naphtho-2-yl)-4,6-bis-trichloromethyl-s-triazine,
2-(5-methoxy-naphtho-1-yl)-4,6-bis-trichloromethyl-s-triazine,
2-(4,7-dimethoxy-naphtho-1-yl)-4,6-bis-trichloromethyl-s-triazine,
2-(6-methoxy-naphtho-2-yl)-4,6-bis-trichloromethyl-s-triazine,
2-(4,5-dimethoxy-naphtho-1-yl)-4,6-bis-trichloromethyl-s-triazine,
4-[p-N,N-di(ethoxycarbonylmethyl)aminophenyl]-2,6-di(trichloromethyl)-s-triazine,
4-(o-methyl-p-N,N-di(ethoxycarbonylmethyl)aminophenyl)-2,6-di(trichloromethyl)-s-triazine,
4-(p-N,N-di(chloroethyl)aminophenyl)-2,6-di(trichloromethyl)-s-triazine,
4-[o-methyl-p-N,N-di(chloroethyl)aminophenyl]-2,6-di(trichloromethyl)-s-triazine,
4-(p-N-chloroethylaminophenyl)-2,6-di(trichloromethyl)-s-triazine,
4-(p-N-ethoxycarbonylmethylaminophenyl)-2,6-di(trichloromethyl)-s-triazine,
4-[p-N,N-di(phenyl)aminophenyl]-2,6-di(trichloromethyl)-s-triazine,
4-(p-N-chloroethylcarbonylaminophenyl)-2,6-di(trichloroethyl)-s-triazine,
4-[p-N-(p-methoxyphenyl)carbonylaminophenyl]-2,6-di(trichloromethyl)-s-triazine,
4-[m-N,N-di(ethoxycarbonylmethyl)aminophenyl]-2,6-di(trichloromethyl)-s-triazine,
4-[m-bromo-p-N,N-di(ethoxycarbonylmethyl)aminophenyl]-2,6-di(trichloromethyl)-s-triazine,
4-[m chloro-p-N,N-di(ethoxycarbonylmethyl)aminophenyl]-2,6-di(trichloromethyl)-s-triazine,
4-[m-fluoro-p-N,N-di(ethoxycarbonylmethyl)aminophenyl]-2,6-di(trichloromethyl)-s-triazine,
4-[o-bromo-p-N,N-di(ethoxycarbonylmethyl)aminophenyl]-2,6-di(trichloromethyl)-s-triazine,
4-[o-chloro-p-N,N-di(ethoxycarbonylmethyl)aminophenyl]-2,6-di(trichloromethyl)-s-triazine,
4-[o-fluoro-p-N,N-di(ethoxycarbonylmethyl)aminophenyl]-2,6-di(trichloromethyl)-s-triazine,
4-[m-bromo-p-N,N-di(chloroethyl)aminophenyl]-2,6-di(trichloromethyl)-s-triazine,
4-[o-chloro-p-N,N-di(chloroethyl)aminophenyl]-2,6-di(trichloromethyl)-s-triazine,
4-[o-fluoro-p-N,N-di(chloroethyl)aminophenyl]-2,6-di(trichloromethyl)-s-triazine,
4-[m-bromo-p-N,N-di(chloroethyl)aminophenyl]-2,6-di(trichloromethyl)-s-triazine,
4-[m-chloro-p-N,N-di(chloroethyl)aminophenyl]-2,6-di(trichloromethyl)-s-triazine,
4-[m-fluoro-p-N,N-di(chloroethyl)aminophenyl]-2,6-di(trichloromethyl)-s-triazine,
4-(m-bromo-p-N-ethoxycarbonylmethylaminophenyl)-2,6-di(trichloromethyl)-s-triazine,
4-(m-chloro-p-N-ethoxycarbonylmethylaminophenyl)-2,6-di(trichloromethyl)-s-triazine,
4-(m-fluoro-p-N-ethoxycarbonylmethylaminophenyl)-2,6-di(trichloromethyl)-s-triazine,
4-(o-bromo-p-N-ethoxycarbonylmethylaminophenyl)-2,6-di(trichloromethyl)-s-triazine,
4-(o-chloro-p-N-ethoxycarbonylmethylaminophenyl)-2,6-di(trichloromethyl)-s-triazine,
4-(o-fluoro-p-N-ethoxycarbonylmethylaminophenyl)-2,6-di(trichloromethyl)-s-triazine,
4-(m-bromo-N-chloroethylaminophenyl)-2,6-di(trichloromethyl)-s-triazine,
4-(m-chloro-p-N-chloroethylaminophenyl)-2,6-di(trichloromethyl)-s-triazine,
4-(m-fluoro-p-N-chloroethylaminophenyl)-2,6-di(trichloromethyl)-s-triazine,
4-(o-bromo-p-N-chloroethylaminophenyl)-2,6-di(trichloromethyl)-s-triazine,
4-(o-chloro-p-N-chloroethylaminophenyl)-2,6-di(trichloromethyl)-s-triazine,
4-(o-fluoro-p-N-chloroethylaminophenyl)-2,6-di(trichloromethyl)-s-triazine, and the like.

Other useful examples thereof include TAZ series products (e.g., TAZ-107, TAZ-110, TAZ-104, TAZ-109, TAZ-140, TAZ-204, TAZ-113, TAZ-123, etc.) manufactured by Midori Kagaku Co, Ltd., T series products (e.g., T-OMS, T-BMP, T-R, T-B, etc.) manufactured by PANCHIM; IRGACURE series products (e.g., IRGACURE 651, IRGACURE 184, IRGACURE 500, IRGACURE 1000, IRGACURE 149, IRGACURE 819, IRGACURE 261, etc.); DAROCUR series products (e.g., DAROCUR 1173, etc.) manufactured by Ciba Specialty Chemicals;

4,4'-bis(diethylamino)-benzophenone, 2-(O-benzoyloxime)-1-[4-(phenylthio)phenyl]-1,2-octandione, 2-benzyl-2-dimethylamino-4-morpholinobutylophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-phenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methyl mercaptophenyl)-4,5-diphenylimidazolyl dimer, benzoin isopropylether, and the like.

Examples of the α-aminoketone compounds include IRGACURE series products (IRGACURE 907, IRGACURE 369) manufactured by Ciba Specialty Chemicals, 2-methyl-1-phenyl-2-morpholinopropan-1-one, 2-methyl-1-[4-(hexyl)phenyl]-2-morpholinopropan-1-one, 2-ethyl-2-dimethylamino-1-(4-morpholinophenyl)-butanone-1, and the like.

The oxime compounds are not particularly limited, and examples thereof include 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, 1-(4-methylsulfanyl-phenyl)-butane-1,2-butane-2-oxime O-acetate, 1-(4-methylsulfanyl-phenyl)-butan-1-one-oxime O-acetate, O-acetate of ethyl hydroxyimino-(4-methylsulfanyl-phenyl)-acetate, O-benzoate of ethyl hydroxyimino-(4-methylsulfanyl-phenyl)-acetate, and the like.

Among such other initiator described above, from the viewpoints of availability and stability, the benzyldimetylketal compound is preferably, for example, IRGACURE 651; the α-hydroxyketone compound is preferably, for example, IRGACURE 184, 1173, 500, 1000, or 2959; the α-aminoketone compound is preferably, for example, IRGACURE 907 or 369; the phosphine oxide compounds (blend) is preferably, for example, IRGACURE 1700, 149, 1850, 819, or 184; the metallocene compound is preferably, for example, IRGACURE 784 or 261 (manufactured by Ciba Specialty Chemicals); and the analogues/similar compounds thereof are also favorable.

As described above, the photopolymerization initiator is preferably a compound that does not generate an acid by decomposition from the points of the light resistance and heat resistance of colorant (in particular, dye); and thus, the compound that does not generate an acid by decomposition is preferably at least one compound selected from benzyldimethylketal compounds, α-hydroxyketone compounds, α-aminoketone compounds, phosphine oxide compounds, metallocene compounds, oxime compounds, triallylimidazole dimer, benzothiazole compounds, benzophenone compounds, acetophenone compounds and derivatives thereof, and cyclopentadiene-benzene-iron complexes and salts thereof. At least one compound selected from the group consisting of α-aminoketone compounds, phosphine oxide compounds, metallocene compounds, oxime compounds, and triallylimidazole dimer is more preferable.

In addition to the photopolymerization initiators described above, the composition according to the invention may contain other known photopolymerization initiators. Specific examples thereof include the vicinal polyketol aldonyl compounds described in U.S. Pat. No. 2,367,660; the α-carbonyl compounds described in U.S. Pat. Nos. 2,367,661 and 2,367,670; the acyloin ethers described in U.S. Pat. No. 2,448,828; the α-hydrocarbon-substituted aromatic acyloin compounds described in U.S. Pat. No. 2,722,512; the polynuclear quinone compounds described in U.S. Pat. Nos. 3,046,127 and 2,951,758; the combination of triallylimidazole dimer and p-aminophenylketone described in U.S. Pat. No. 3,549,367; the benzothiazole compounds and trihalomethyl-s-triazine compounds described in JP-B No. 51-48516; and the like.

The content of photopolymerization initiator in the colorant-containing curable composition is preferably 0.01 to 50 wt %, more preferably 1 to 30 wt %, and pticularly preferably 1 to 20 wt %, with respect to the solid matter of the monomer, A photopolymerization initiator content in the range of 0.01 to 50 wt % leads to prevention of the deterioration in film strength due to decrease in molecular weight.

The photopolymerization initiator may be used in combination with a sensitizer or a photostabilizer. Specific examples thereof include benzoin, benzoin methylether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzil, dibenzalacetone, p-(dimethylamino)phenylstyrylketone, p-(dimethylamino)phenyl-p-methylstyrylketone, benzophenone, p-(dimethylamino) benzophenone (or Michler's ketone), p(diethylamino)benzophenone, benzanthrone, the benzothiazole compounds and others described in JP-B No. 51-48516, TINUVIN 1130 and 400, and the like.

<Solvent>

In preparation of the colorant-containing curable composition according to the invention, a solvent can be used in general. The solvent is basically not particularly limited as long as it satisfies the requirements in the solubility of respective components and the coating property of curable composition, and is preferably selected in consideration of the solubility of binder, coating property, and stability.

Specific examples of the solvents include, esters such as ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, and ethyl ethoxyacetate;

alkyl 3-oxypropionate esters such as methyl 3-oxypropionate, ethyl 3-oxypropionate, (e.g., methyl 3-methoxypropionate, ethyl 3-methoxypropionate, methyl 3-ethoxypropionate, and ethyl 3-ethoxypropionate); alkyl 2-oxypropionate esters such as methyl 2-oxypropionate, ethyl 2-oxypropionate, propyl 2-oxypropionate, (e.g. methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate); methyl pyruvate, ethyl pyruvate, propyl pyruvate, methyl acetoacetate, ethyl acetoacetate, methyl 2-oxobutanoate, and ethyl 2-oxobutanoate;

ethers such as diethylene glycol dimeylether, tetrahydrofuran, ethylene glycol monomethylether, ethylene glycol monoethylether, methylcellosolve acetate, ethylcellosolve acetate, diethylene glycol monomethylether, diethylene glycol monoethylether, diethylene glycol monobutylether, propylene glycol methylether, propylene glycol methylether acetate, propylene glycol ethylether acetate, and propylene glycol propylether acetate; ketones such as methylethylketone, cyclohexanone, 2-heptanone, and 3-heptanone; aromatic hydrocarbons such as toluene and xylene; and the like.

Among them, more preferable are methyl 3-ethoxypropionate, ethyl 3-ethoxypropionate, ethylcellosolve acetate, ethyl lactate, diethylene glycol dimethylether, butyl acetate, methyl 3-methoxypropionate, 2-heptanone, cyclohexanone, ethylcarbitol acetate, butyl carbitol acetate, propylene glycol methylether, propylene glycol methylether acetate, and the like. Among them, ethyl lactate, cyclohexanone, and propylene glycol methylether acetate are most preferable.

When the colorant-containing curable composition is used as a positive composition, the colorant-containing curable composition according to the invention may contain a photosensitive agent and preferably a solvent and/or a hardening agent additionally, in addition to the compound (colorant) represented by Formula (1). Details of the solvent are as described above.

The photosensitive agent is preferably a naphthoquinone diazide compound. Favorable examples of the naphthoquinone diazide compounds include o-benzoquinonedianidesulfonic esters and o-naphthoquinonediazidesusfonic esters.

Specific examples thereof include o-naphthoquinonediazide-5-sulfonic ester, o-naphthoquinonediazide-5-sulfonic amide, o-naphthoquinonediazide-4-sulfonic ester, o-naphthoquinonediazide-4-sulfonic amide, and the like. These ester and amide compounds can be prepared, for example, by a known method using a phenol compound represented by Formula (I) described in JP-A Nos. 2-84650 and 3-49437.

The melamine compounds, methylol group-containing compounds, and the like described above as examples of the crosslinking agents are favorably used as the hardening agents.

When used as a positive composition, the composition may contain a binder (in particular, alkali-soluble binder) additionally, and examples of the binders favorably used in combination include novolak resins, vinylphenol resins and the like.

As an alternative, when the colorant-containing curable composition according to the invention is used as a positive composition, the colorant-containing curable composition according to the invention may contain a photochemical acid generator and a hardening agent, preferably as well as a solvent, together with the compound (colorant) represented by Formula (I). Details of the solvent is as described above.

The photochemical acid generator is not particularly limited as long as it is a compound that generates an acid by exposure to light, and examples thereof include various oxime compounds such as α-(4-toluenesulfonyloxyimino) phenylacetonitrile, various iodonium compounds, various sulfonium compounds, various trihalomethyltriazine compounds, and the like.

When the colorant-containing curable composition according to the invention is used as a positive composition, the binder (in particular, alkali-soluble phenol resin) and the hardening agent described above are preferably dissolved in amounts of respectively approximately 2 to 50 wt % and approximately 2 to 30 wt %. The naphthoquinone diazide compound and the colorant (including the compounds represented by Formula (1)) described above are preferably added normally in amounts of respectively approximately 2 to 30 wt % and approximately 2 to 50 wt % in the solution containing the binder and the hardening agent.

<Other Components>

In addition to the components above, the composition according to the invention may contain other components shown below.

—Thermal Polymerization Inhibitor—

The composition according to the invention preferably contains a thermal polymerization inhibitor. Favorable examples of the thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene-bis(4-methyl-6-t-butylphenol), 2-mercaptobenzimidazole, and the like, —Various Additives—

The composition according to the invention may contain, as needed, various additives such as filler, polymeric compound other than those described above, surfactant, adhesion accelerator, antioxidant, ultraviolet absorbent, aggregation inhibitor, and others.

Specific examples of the various additives include: fillers such as glass and alumina; polymeric compounds other than binder resin such as polyvinylalcohol, polyacrylic acid, polyethylene glycol monoalkylethers, and polyfluoroalkyl acrylates; surfactants such as nonionic, cationic, and anionic surfactants; adhesion accelerators such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; antioxidants such as 2,2-thiobis(4-methyl-6-t-butylphenol) and 2,6-di-t-butylphenol, ultraviolet absorbents such as 2-(3-t-butyl-5-methyl-2-hydroxyphenyl)-5-chlorobenzotriazole and alkoxybenzophenones; and aggregation inhibitors such as sodium polyacrylate.

In addition, an organic carboxylic acid, preferably a low-molecular weight organic carboxylic acid having a molecular weight of 1,000 or less, may be added to the composition, for acceleration of alkaline solubilization of the unhardened area and improvement of the developing property of the dye-containing negative curable composition according to the invention.

Specific examples thereof include fatty monocarboxylic acids such as formic acid, acetic acid, propionic acid, butyric acid, valeric acid, pivalic acid, caproic acid, diethylacetic acid, enanthic acid, and caprylic acid; fatty dicarboxylic acids such as oxalic acid, malonic acid, succinic acid, glutaric acid, adipic acid, pimelic acid, suberic acid, azelaic acid, sebacic acid, brassic acid, methylmalonic acid, ethylmalonic acid, dimethylmalonic acid, methylsuccinic acid, tetramethylsuccinic acid, and citraconic acid; aliphatic tricarboxylic acids such as tricarballylic acid, aconitic acid, and camphoronic acid; aromatic monocarboxylic acids such as benzoic acid, toluic acid, cuminic acid, hemellitic acid, and mesitylene acid; aromatic polycarboxylic acids such as phthalic acid, isophthalic acid, terephthalic acid, trimellitic acid, trimesic acid, mellophanic acid, and pyromellitic acid; other carboxylic acids such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumalic acid, and umbellic acid.

The colorant-containing curable composition according to the invention can be used as a colored pixel-forming material such as color filter for use in liquid crystal display elements (LCD) and solid-state imaging devices (e.g., CCD, CMOS, etc.) and also, as a material for preparation of printing ink, inkjet ink, paint, and others.

<<Color Filter and its Production Method>>

Hereinafter, the method of preparing a color filter according to the invention will be described in detail.

In preparation of the color filter according to the invention, the colorant-containing curable composition according to the invention described above is used. The color filter according to the invention contains the compound represented by Formula (I) (colorant; including its tautomers) described above, and is prepared most favorably by using the colorant-containing curable composition according to the invention described above.

Specifically, it is possible to form a colored pattern by forming a radiation ray-sensitive composition layer by coating the colorant-containing curable composition on a support by an application method such as spin coating, cast coating, or roll coating, exposing the layer though a predetermined mask pattern to light, and developing the layer with a developer (image-forming step). A step of hardening the formed colored pattern by heating and/or light exposure may be installed additionally as needed.

The light or radiation ray used for the exposure is particularly preferably an ultraviolet ray such as g ray, h ray, or i ray.

In preparation of the color filter, it is possible to prepare a color filter having a desired number of color tones, by repeating the image-forming step above (and the hardening step as needed) according to the desired number of color tones.

Examples of the supports for use include: soda-lime glass, PYREX (R) glass, and quartz glass for use in liquid crystal display elements and those obtained by providing a transparent conductive film on such supports; substrates for photo-electric-conversion elements (such as silicon substrate) for use in image sensors; complimentary metal-oxide semiconductors (CMOSs); and the like. The support may optionally have a black stripe formed for separation of pixels.

In addition, an undercoat layer may be formed on the support, as needed, for improvement in adhesion to the upper layer, prevention of diffusion of substances, or flattening of the substrate surface.

The developer for use in preparation of the color filter according to the invention is not particularly limited as long as it dissolves the unhardened area of the composition according to the invention and does not dissolve the hardened area for filter. Specifically, the developer may be a combination of various organic solvents or an alkaline aqueous solution. Examples of organic solvents include those described above for use in preparation of the composition according to the invention.

The aqueous alkaline solution is favorably an aqueous alkaline solution containing an alkaline compound such as sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, or 1,8-diazabicyclo-(5,4,0)-7-undecene at a concentration of 0.001 to 10 wt %, preferably 0.01 to 1 wt %. When such an aqueous alkaline solution is used as the developer, the substrate is generally washed with water after development.

The color filter according to the invention may be used in a solid-state imaging device, for example, in liquid crystal display elements and CCDs, and particularly favorably, for example, in high-definition CCD elements and CMOS elements having a definition of more than 1,000,000 pixels. The color filter according to the invention may be used, for example, as a color filter to be installed between a light-receiving unit for CCD corresponding to each pixel and a photoconverging microlens.

Some exemplary embodiments of the invention will be shown below.

<1> A colorant-containing curable composition containing a colorant, the colorant including a compound represented by the following Formula (I) or its tautomer:

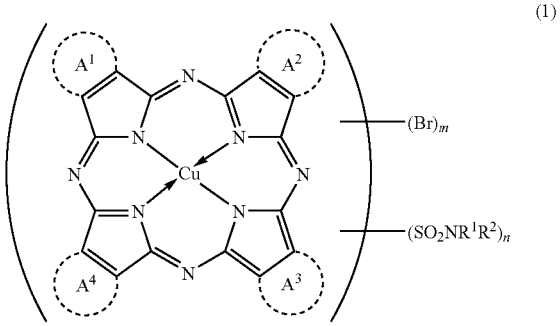

In Formula (I) above, rings $A^1$, $A^2$, $A^3$, and $A^4$ each independently represent a group represented by structure 1 or 2:

Structure 1

Structure 2 and at least one of the rings $A^1$, $A^2$, $A^3$, and $A^4$ represents a group represented by structure 2; $R^1$ and $R^2$ each independently represent a hydrogen atom or a substituted or unsubstituted alkyl group; m represents an integer of 1 to 8; and n is an integer of 1 to 4. However, $R^1$ and $R^2$ are not hydrogen atoms at the same time.

<2> The colorant-containing curable composition described in <1>, wherein $R^1$ and $R^2$ in Formula (1) above each independently represent a hydrogen atom, a unsubstituted alkyl group, or a substituted alkyl group containing oxygen atoms in the form of at least one of an ether, carbonyl, or ester bond, provided that $R^1$ and $R^2$ are not hydrogen atoms at the same time.

<3> The colorant-containing curable composition described in <1> or <2>, wherein $R^1$ and $R^2$ in Formula (1) each independently represent a hydrogen atom, an unsubstituted alkyl group having 1 to 12 carbon atoms, or a substituted alkyl group having 2 to 12 carbon atoms containing one to four oxygen atoms oxygen atom in the form of at least one of an ether, carbonyl, or ester bond, provided that $R^1$ and $R^2$ are not hydrogen atoms at the same time, and m is an integer of 1 to 4.

<4> The colorant-containing curable composition described in any one of <1> to <3>, wherein at least one of $R^1$ and $R^2$ in Formula (1) above represents a substituted alkyl group having 2 to 12 carbon atoms containing one to four oxygen atoms in the form of at least one of an ether, carbonyl, or ester bond.

<5> The colorant-containing curable composition described in <4>, wherein at least one of $R^1$ and $R^2$ in Formula (1) above represents a substituted alkyl group represented by the following Formula (2):

(2)

In Formula (2), $R^3$ and $R^4$ each independently represent a hydrogen atom, an unsubstituted alkyl group, an alkyl group containing oxygen atoms in the form of at least one of an ether, carbonyl, or ester bond, an alkylcarbonyl group, or an alkoxycarbonyl group; and at least one of $R^3$ and $R^4$ represents an alkyl group containing oxygen atoms in the form of at least one of an ether, carbonyl, or ester bond, an alkylcarbonyl group, or an alkoxycarbonyl group.

<6> The colorant-containing curable composition described in <5>, wherein $R^3$ and $R^4$ in Formula (2) each independently represent a hydrogen atom, an unsubstituted alkyl group having 1 to 8 carbon atoms, a substituted alkyl group having 2 to 10 carbon atoms containing one to four oxygen atoms in the form of at least one of an ether, carbonyl, or ester bond, an alkylcarbonyl group having 2 to 10 carbon atoms, or an alkoxycarbonyl group having 2 to 10 carbon atoms; and at least one of $R^3$ and $R^4$ represents a substituted alkyl group having 2 to 10 carbon atoms and containing one to four oxygen atoms in the form of at least one of an ether, carbonyl, or ester bond, an alkylcarbonyl group, or an alkoxycarbonyl group.

<7> The colorant-containing curable composition described in any one of <1> to <6>, further comprising a monomer.

<8> The colorant-containing curable composition described in <7>, wherein the monomer includes a (meth)acrylic ester-based monomer.

<9> The colorant-containing curable composition described in <8>, wherein the monomer includes a tetra- or higher-functional (meth)acrylic ester-based monomer.

<10> The colorant-containing curable composition described in any one of <1> to <9>, further comprising a binder.

<11> The colorant-containing curable composition described in <10>, wherein the binder includes an alkali-soluble (meth)acrylic resin.

<12> The colorant-containing curable composition described in <11>, wherein the (meth)acrylic resin has polymerizable side chains.

<13> The colorant-containing curable composition described in any one of <1> to <12>, further comprising a photopolymerization initiator.

<14> The colorant-containing curable composition described in <13>, wherein the photopolymerization initiator includes at least one compound selected from the group consisting of trihalomethyl-s-triazine compounds, benzyldimethyl ketal compounds, α-hydroxyketone compounds, α-aminoketone compounds, phosphine oxide compounds, metallocene compounds, oxime compounds, triallylimidazole dimer, benzothiazole compounds, benzophenone compounds, acetophenone compounds and derivatives thereof, cyclopentadiene-benzene-iron complexes and salts thereof, halomethyloxadiazole compounds, and 3-aryl substituted coumarin compounds.

<15> The colorant-containing curable composition described in <13> or <14>, wherein the photopolymerization initiator is a compound that does not generate an acid by decomposition.

<16> The colorant-containing curable composition described in <15>, wherein the photopolymerization initiator is at least one compound selected from the group consisting of α-aminoketone compounds, phosphine oxide compounds, metallocene compounds, oxime compounds, and triallylimidazole dimer.

<17> The colorant-containing curable composition described in any one of <1> to <16>, further comprising a crosslinking agent.

<18> The colorant-containing curable composition described in any one of <1> to <12>, further comprising a photosensitive agent wherein the composition is a positive composition.

<19> The colorant-containing curable composition described in <18>, wherein the photosensitive agent is an o-benzoquinonediazidesulfonic ester or an o-naphthoquinone diazide sulfonic ester.

<20> The colorant-containing curable composition described in <18> or <19>, further comprising a hardening agent.

<21> The colorant-containing curable composition described in any one of <1> to <12>, further comprising a photochemical acid generator and a hardening agent, wherein the composition is a positive composition.

<22> A color filter, comprising a compound represented by the following Formula (1) or its tautomer:

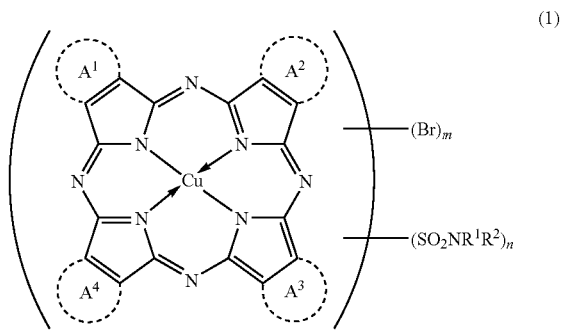

In Formula (1) above, rings $A^1$, $A^2$, $A^3$, and $A^4$ each independently represent a group represented by structure 1 or 2:

Structure 1

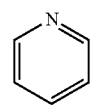

Structure 2 and at least one of the rings $A^1$, $A^2$, $A^3$, and $A^4$ represents a group represented by structure 2; $R^1$ and $R^2$ each independently represent a hydrogen atom or a substituted or unsubstituted alkyl group; m represents an integer of 1 to 8; and n is an integer of 1 to 4. However, $R^1$ and $R^2$ are not hydrogen atoms at the same time.

<23> A color filter prepared by using the colorant-containing curable composition described in <1> to <21>.

<24> A method of producing a color filter, comprising applying the colorant-containing curable composition described in any one of <1> to <21> onto a substrate, exposing the composition through a mask to light, and forming a pattern by developing the composition.

EXAMPLES

Hereinafter, the invention will be described more specifically with reference to Examples. However, it should be understood that Examples should not be construed as limiting the invention. In the following, the term "part" means "part by weight", unless specified otherwise.

Synthesis Example 1

Preparation of Specific Example 28 of Tetraazaporphyrin Compound 29.6 g of phthalic anhydride, 22.2 g of 4-bromophthalic anhydride, 16.7 g of pyridine-2,3-dicarboxylic acid, 144 g of urea, 9.9 g cuprous chloride, and 1.6 g of ammonium molybdenate were suspended in 400 mL of 1-chloronaphthalene, and the mixture was stirred at 190 to 220° C. for 5 hours. The reaction mixture was poured into 250 mL of methanol, and the precipitate was filtered, washed with methanol, water, and acetone in that order, and dried, to give 31.3 g of a blue bromo-substituted traazaporphyrin compound.

13.1 g of the bromo-substituted tetraazaporphyrin compound obtained was added in small portions into 100 g of chlorosulfonic acid at 20° C. or lower over 30 minutes. Then, the mixture was heated to 70 to 80° C., stirred at the same temperature for 1 hour, heated to 140 to 145° C. over 2 hours, allowed to react at the same temperature for 4 hours, and then cooled to 80° C. In addition, 30 g of thionyl chloride was added dropwise thereto over 1 hour while the mixture was kept at 70 to 80° C., and the mixture was stirred at 70 to 80° C. for 4 hours, cooled to 15 to 20° C., and stirred at the same temperature additionally for 12 hours. The reaction mixture solution was poured into 1,000 g of ice water gradually in small portions, and the deposit was separated by filtration and washed with ice water until it becomes neutral, to give a hydrated paste of sulfonyl chloride of the bromo-substituted tetraazaporphyrin compound. It was immediately poured into 400 g of ice water, the mixture was stirred at 10° C. or lower for 30 minutes; and 30 g of 2-amino-1-(2-ethoxyethoxy)butane was added dropwise. The mixture was then heated to 20 to 30° C. and stirred at the same temperature for 18 hours; the product was collected by filtration, redispersed in 200 g of water and filtered twice, and dried at 60° C. for 16 hours, to give 18 g of a blue powder. The powder was further recrystallized from ethyl acetate, to give 10 g of a blue crystal.

Fluorescent X-ray analysis of the blue crystal revealed that the average number of sulfonamide groups per molecule was 1.9 and the average number of bromine atoms per molecule was 1.2, from the intensity ratio of copper as the central metal in the bromo-substituted tetraazaporphyrin skeleton to the sulfur and bromine atoms in the sulfonamide groups.

Separately, 5 g of the blue crystal obtained was redissolved in an ethyl acetate/methanol mixture solution, and separated and purified by silica gel column chromatography, to give 1.5 g of a purified blue powder. Fluorescent X-ray analysis of the purified blue powder revealed that the number of sulfonamide groups per molecule was 2 and the number of bromine atoms per molecule was 1, from the intensity ratio of copper as the central metal in the bromo-substituted tetraazaporphyrin skeleton to the sulfur and bromine atoms in the sulfonamide groups, while the result of FD-MS analysis, m/z=1100.2, confirmed that the product was a compound containing, as its major component, the specific example 28 having an introduced pyridine ring.

Synthesis Example 2

Preparation of Specific Example 29 of Tetraazaporphyrin Compound 14.8 g of phthalic anhydride, 45.4 g of 4-bromophthalic hydride, 16.7 g of pyridine-2,3-dicarboxylic acid, 144 g of urea, 9.9 g of cuprous chloride, and 1.6 g of ammonium molybdenate were suspended in 400 mL of 1,3-dimethyl-2-imidizolidinone, and the mixture was stirred at 190 to 220° C. for 5 hours. Then, the mixture was post-treated in a similar manner to Example 1, to give 41.1 g of a bromo-substituted tetraazaporphyrin compound. It was also chlorosulfonylated, amidated, and post-treated in a similar manner to Example 1, to give 15.5 g of a blue crystal.

Fluorescent X-ray analysis of the blue crystal revealed that the average number of sulfonamide groups per molecule was 2.1 and the average number of bromine atoms per molecule was 2.2, from the intensity ratio of copper as the central metal in the bromo-substituted tetraazaporphyrin skeleton to sulfur and bromine atoms in the sulfonamide groups.

Separately, 5 g of the blue crystal obtained was redissolved in an ethyl acetate/methanol mixture solution, and separated and purified by silica gel column chromatography, to give 1.0 g of a purified blue powder. Fluorescent X-ray analysis of the purified blue powder revealed that the average number of sulfonamide groups per molecule was 2 and the number of bromine atoms per molecule was 2, from the intensity ratio of copper as the central metal in the bromo-substituted tetraazaporphyrin skeleton to the sulfur and bromine atoms in the sulfonamide groups, while the result of FD-MS analysis, m/z=1178.1, confirmed that the product was a compound containing, as its major component, the specific example 29 having an introduced pyridine ring.

Synthesis Example 3

Preparation of Specific Example 30 of Tetraazaporphyrin Compound 68.1 g of 4-bromophthalic anhydride, 16.7 g of pyridine-2,3-dicarboxylic acid, 144 g of urea, 9.9 g of cuprous chloride, and 1.6 g of ammonium molybdenate were suspended in 400 mL of 1,3-dimethyl-2-imidizolidinone, and the mixture was stirred at 190 to 220° C. for 5 hours. Then, the mixture was post-treated in a similar manner to Example 1, to give 25 g of a bromo-substituted tetraazaporphyrin compound. It was also chlorosulfonylated, amidated, and post-treated in a similar manner to Example 1, to give 9.9 g of a blue crystal.

Further, 5 g of the blue crystal obtained was redissolved in an ethyl acetate/methanol mixture solution, and separated and purified by silica gel column chromatography, to give 3.0 g of a purified blue powder. Fluorescent X-ray analysis of the purified blue powder revealed that the number of sulfonamide groups per molecule was 2 and the number of bromine atoms per molecule was 3, from the intensity ratio of copper as the central metal in the bromo-substituted tetraazaporphyrin skeleton to the sulfur and bromine atoms in the sulfonamide groups, while the result of FD-MS analysis, m/z=1256.0, confirmed that the product was a compound containing, as its major component, the specific example 30 having an introduced pyridine ring.

Synthesis Example 4

Preparation of Specific Example 7 of Tetraazaporphyrin Compound

A blue crystal (13 g) was prepared in a similar manner to Synthesis Example 1, except that 30 g of 2-amino-1-(2-ethoxyethoxy)butane used after the sulfonyl chloride of the hydrated paste-like bromo-substituted tetraazaporphyrin compound in Example 1 was poured and dispersed in ice water was changed to 25 g of 3-butoxypropylamine.

5 g of the blue crystal obtained was redissolved in an ethyl acetate/methanol mixture solution, and separated and purified by silica gel column chromatography, to give 3.0 g of a purified blue powder. Fluorescent X-ray analysis of the purified blue powder revealed that the number of sulfonamide groups per molecule was 2 and the number of bromine atoms per molecule was 1, from the intensity ratio of copper as the central metal in the bromo-substituted tetraazaporphyrin skeleton to the sulfur and bromine atoms in the sulfonamide groups, while the result of FD-MS analysis, m/z=1040.1, confirmed that the product was a compound containing, as its major component, the specific example 7 having an introduced pyridine ring.

Synthesis Example 5

Preparation of Specific Examples 16 of Tetraazaporphyrin Compound

A blue crystal (11 g) was prepared in a similar manner to Synthesis Example 1, except that 30 g of 2-amino-1-(2-ethoxyethoxy)butane used after the sulfonyl chloride of the hydrated paste-like bromo-substituted tetraazaporphyrin compound in Example 1 was poured and dispersed in ice water was changed to 40 g of 2-ethylamine.

5 g of the blue crystal obtained was redissolved in an ethyl acetate/methanol mixture solution and separated and purified by silica gel column chromatography, to give 1.0 g of a purified blue powder. Fluorescent X-ray analysis of the purified blue powder revealed that the number of sulfonamide groups per molecule was 2 and the number of bromine atoms per molecule was 1, from the intensity ratio of copper as the central metal in the bromo-substituted tetraazaporphyrin skeleton to the sulfur and bromine atoms in the sulfonamide groups, while the result of FD-MS analysis, m/z=1036.2, confined that the product was a compound containing, as its major component, the specific example 16 having an introduced pyridine ring.

Synthesis Example 6

Preparation of Specific Example 65 of Traazaporphyrin Compound 14.8 g of phthalic anhydride, 22.7 g of 4-bromophthalic anhydride, 33.4 g of pyridine-2,3-dicarboxylic acid, 144 g of urea, 9.9 g of cuprous chloride, and 1.6 g of ammonium molybdenate were suspended in 400 mL of 1-chloronaphthalene, and the mixture was stirred at 190 to 220° C. for 5 hours. Then, the mixture was post-treated in a similar manner to Example 1, to give 28 g of a bromo-substituted tetraazaporphyrin compound. It was also chlorosulfonylated, amidated, and posttreated in a similar manner to Example 1, to give 6.8 g of a blue crystal.

Then, 5 g of the blue crystal obtained was redissolved in an ethyl acetate/methanol mixture solution and separated and purified by silica gel column chromatography, to give 1.0 g of a purified blue powder. Fluorescent X-ray analysis of the purified blue powder revealed that the average number of sulfonamide groups per molecule was 2 and that of bromine atoms 1, from the intensity ratio between copper as the central metal in the bromo-substituted tetraazaporphyrin skeleton and the sulfur and bromine atoms in the sulfonamide groups, while the result of FD-MS analysis, m/z=1179.1, confirmed Mat the product was a compound containing the specific example 65 having two introduced pyridine rings as its major component.

Synthesis Example 7

Preparation of Specific Example 33 of Tetraazaporphyrin Compound

A blue crystal (6.7 g) was prepared in a similar manner to Synthesis Example 1, except that 30 g of 2-amino-1-(2-ethoxyethoxy)butane used after the sulfonyl chloride of the hydrated paste-like bromo-substituted tetraazaporphyrin compound in Example 1 was poured and dispersed in ice water was changed to 20 g of L-methyl valinate hydrochloride salt and 15 g of triethylamine.

5 g of the blue crystal obtained was redissolved in an ethyl acetate/methanol mixture solution and separated and purified by silica gel column chromatography, to give 1.0 g of a purified blue powder. Fluorescent X-ray analysis of the purified blue powder revealed that the number of sulfonamide groups per molecule was 2 and the number of bromine atoms per molecule was 1, from the intensity ratio of copper as the central metal in the bromo-substituted tetraazaporphyrin skeleton to the sulfur and bromine atoms in the sulfonamide groups, while the result of FD-MS analysis, m/z=1040.1, confirmed that the product was a compound containing, as its major component, the specific example 33 having an introduced pyridine ring.

Synthesis Example 8

Preparation of Specific Example 101 of Tetraazaporphyrin Compound 22.7 g of 4-bromophthalic anhydride, 50.1 g of pyridine-2,3-dicarboxylic acid, 144 g of urea, 9.9 g of cuprous chloride, and 1.6 g of ammonium molybdenate were suspended in 400 mL of 1-chloronaphthalene, and the mixture was stirred at 190 to 220° C. fro 5 hours. Then, the mixture was post-treated in a similar manner to Example 1, to give 15 g of a bromo-substituted tetraazaporphyrin compound. It was also chlorosulfonylated (reaction temperature: 125 to 130° C.), amidated, and post-treated in a similar manner to Example 1, to give 4.5 g of a blue crystal.

3.5 g of the blue crystal obtained was redissolved in an ethyl acetate/methanol mixture solution and separated and purified by silica gel column chromatography, to give 0.8 g of a purified blue powder. Fluorescent X-ray analysis of the purified blue powder revealed that the number of sulfonamide groups per molecule was 1 and the number of bromine atoms per molecule was 1, from the intensity ratio of copper as the central metal in the bromo-substituted tetraazaporphyrin skeleton to the sulfur and bromine atoms in the sulfonamide groups, while the result of FD-MS analysis, m/z=879.1, confined that the product was a compound containing, as its major component, the specific example 101 having three introduced pyridine rings as its major component.

Comparative Synthesis Example 1

12 g of copper phthalocyanine (manufactured by Tokyo Kasei Kogyo Co. Ltd.) was added gradually in small portions to 120 g of chlorosulfonic acid at 20° C. or lower over 30 minutes. The mixture was then heated to 70 to 80° C., stirred at the sane temperature for 1 hour, heated to 130 to 135° C. over 2 hours, allowed to react at the same temperature for 4 hours, and then cooled to 80° C. Then, 20 g of thionyl chloride was added dropwise over 1 hour while the mixture was kept at 70 to 80° C., and the mixture was stirred at 70 to 80° C. additionally for 4 hours. The mixture was cooled to 15 to 20° C. and stirred at the same temperature for 12 hours. The reaction mixture was poured into 1,000 g of ice water in small portions, and the deposit was collected by filtration and washed with ice water until it becomes neutral, to give sulfonyl chloride of the hydrated paste-like phthalocyanine.

It was immediately poured into 400 g of ice water; the mixture was stirred at 10° C. or lower for 30 minutes; and 20 g of 3-butoxypropylamine was added dropwise thereto. The mixture was then heated to 20 to 30° C. and stirred at the same temperature for 18 hours; the product was collected by filtration, redispersed in 200 g of water and filtered twice, and dried at 60° C. for 15 hours, to give 15 g of a blue powder. It was further recrystallized with ethyl acetate, to give 6.4 g of a blue crystal. Fluorescent X-ray analysis of the blue crystal revealed that the average number of sulfonamide groups per molecule was 3.8 from the intensity ratio of copper as the central metal in the bromo-substituted traazaporphyrin skeleton to the sulfur atoms in the sulfonamide groups.

Examples 1 to 21 and Comparative Example 1

1) Preparation of Dye-Containing Curable Composition

Compounds in each of the compositions shown below were mixed and dissolved, to give the dye-containing curable composition (1) to (21) according to the invention or the comparative dye-containing curable composition (22).

TABLE 1

| | Composition | Alkali-soluble binder | Radical polymerizable monomer | Organic solvent-soluble dye*$_1$ | Photopolymerization initiator | Surfactant | Organic solvent |
|---|---|---|---|---|---|---|---|
| Ex. 1 | (1) | Resin A (5.14 g) | Monomer A (7.73 g) | Exemplary compound 28 (6.0 g) | TAZ107 (1.1 g) | — | Ethyl lactate (80 g) |
| Ex. 2 | (2) | Resin A (5.14 g) | Monomer A (7.73 g) | Exemplary compound 29 (6.0 g) | TAZ104 (1.1 g) | — | Ethyl lactate (80 g) |
| Ex. 3 | (3) | Resin A (5.14 g) | Monomer A (7.73 g) | Exemplary compound 30 (6.0 g) | TAZ104 (1.1 g) | — | Ethyl lactate (80 g) |
| Ex. 4 | (4) | Resin A (5.14 g) | Monomer A (7.73 g) | Exemplary compound 16 (6.0 g) | TAZ107 (1.1 g) | — | Ethyl lactate (80 g) |
| Ex. 5 | (5) | Resin A (5.14 g) | Monomer A (7.73 g) | Exemplary compound 65 (6.0 g) | TAZ104 (1.1 g) | — | Ethyl lactate (80 g) |
| Ex. 6 | (6) | Resin A (5.14 g) | Monomer A (7.73 g) | Exemplary compound 33 (6.0 g) | TAZ107 (1.1 g) | — | Ethyl lactate (80 g) |
| Ex. 7 | (7) | Resin A (5.14 g) | Monomer A (7.73 g) | Exemplary compound 101 (6.0 g) | TAZ107 (1.1 g) | — | Ethyl lactate (80 g) |
| Ex. 8 | (8) | Resin A (5.14 g) | Monomer A (7.73 g) | Exemplary compound 28 (6.0 g) | Oxime A (1.1 g) | — | Ethyl lactate (80 g) |
| Ex. 9 | (9) | Resin A (5.14 g) | Monomer A (7.73 g) | Exemplary compound 29 (6.0 g) | Oxime A (1.1 g) | — | Ethyl lactate (80 g) |
| Ex. 10 | (10) | Resin A (5.14 g) | Monomer A (7.73 g) | Exemplary compound 30 (6.0 g) | Oxime A (1.1 g) | — | Ethyl lactate (80 g) |
| Ex. 11 | (11) | Resin A (5.14 g) | Monomer A (7.73 g) | Exemplary compound 16 (6.0 g) | Oxime A (1.1 g) | — | Ethyl lactate (80 g) |
| Ex. 12 | (12) | Resin A (5.14 g) | Monomer A (7.73 g) | Exemplary compound 65 (6.0 g) | Oxime A (1.1 g) | — | Ethyl lactate (80 g) |
| Ex. 13 | (13) | Resin A (5.14 g) | Monomer A (7.73 g) | Exemplary compound 33 (6.0 g) | Oxime A (1.1 g) | — | Ethyl lactate (80 g) |
| Ex. 14 | (14) | Resin A (5.14 g) | Monomer A (7.73 g) | Exemplary compound 101 (6.0 g) | Oxime A (1.1 g) | — | Ethyl lactate (80 g) |
| Ex. 15 | (15) | Resin A (5.14 g) | Monomer A (7.73 g) | Exemplary compound 30 (6.0 g) | Oxime A (1.1 g) | F475 (0.01 g) | Ethyl lactate (80 g) |
| Ex. 16 | (16) | Resin A (5.14 g) | Monomer A (7.73 g) | Exemplary compound 30 (4.0 g) Exemplary compound 101 (2.0 g) | Oxime A (1.1 g) | — | Ethyl lactate (80 g) |
| Ex. 17 | (17) | Resin A (5.14 g) | Monomer A (7.73 g) | Exemplary compound 30 (4.0 g) C.I. Acid Violet 49 (2.0 g) | Oxime A (1.1 g) | — | Ethyl lactate (80 g) |
| Ex. 18 | (18) | — | Monomer A (12.6 g) | Exemplary compound 28 (6.3 g) | Oxime A (1.1 g) | — | Ethyl lactate (80 g) |
| Ex. 19 | (19) | — | Monomer A (12.6 g) | Exemplary compound 30 (4.3 g) Exemplary compound 101 (2.0 g) | Oxime B (1.1 g) | F475 (0.01 g) | Ethyl lactate (80 g) |
| Comp. Ex. 1 | (22) | Resin A (5.14 g) | Monomer A (7.73 g) | Comparative compound (6.0 g) | Oxime A (1.1 g) | — | Ethyl lactate (80 g) |

*$_1$The respective exemplary compounds are already shown above.

The components in the compositions shown in Table 1 above were specifically as follows:

Resin A: benzyl methacrylate/methacrylic acid copolymer (=70/30 [molar ratio])

Monomer A: DPHA manufactured by Nippon Kayaku Co., Ltd. (product name, major component: dipentaerythritol hexaacrylate)

TAZ-107: manufactured by Midori Kagaku Co., Ltd.

TAZ-104, manufactured by Midori Kagaku Co, Ltd.

Oxime A: 2-O-benzoyl oxime)-1-[4-(phenylthio)phenyl]-1,2-octandione, manufactured by Ciba Specialty Chemicals Co., Ltd.

Oxime B: 1-(O-acetyloxime)-1-[9-ethyl-6-(2-methylbenzoyl)-9H-carbazol-3-yl]ethanone, manufactured by Ciba Specialty Chemicals Co., Ltd.

F475; a surfactant manufactured by Dainippon Ink and Chemicals, Inc. Example 20: positive dye-containing curable composition The following components were mixed, to give a positive dye-containing curable composition (20).

| | |
|---|---|
| Colorant compound according to the invention (specific example 28 described above): | 6.0 g |
| Ethyl lactate: | 80.0 g |
| Following binder P-1: | 18.0 g |
| Following photochemical acid generator PAG-1: | 2.0 g |
| Fluorochemical surfactant (Product name: F-475, manufactured by Dainippon Ink and Chemicals, Inc.): | 0.01 g |

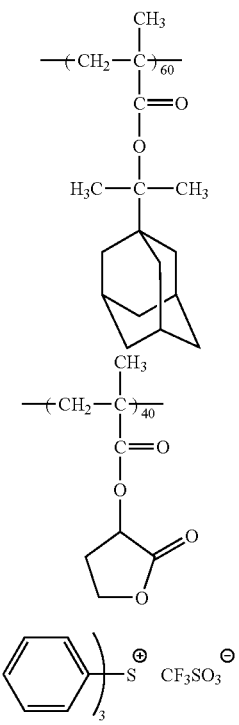

Example 21

Positive Dye-Containing Curable Composition

The following components were mixed to give a positive dye-containing curable composition (21).

| | |
|---|---|
| Colorant compound according to the invention [specific examples 29 described above]: | 6.0 g |
| Ethyl lactate: | 80.0 g |
| Novolak resin that is a condensation product of p-cresol and formaldehyde (molecular weight as polystyrene equivalent molecular weight: 5,500): | 6.0 g |

-continued

| | |
|---|---|
| Hexamethoxymethylol melamine: | 2.0 g |
| Ester prepared in reaction of 2,3,4-trihydroxybenzophenone with o-naphthoquinonediazide-5-sulfonyl chloride: (esterification rate: 80 mol %; quinone diazide compound) | 6.0 g |
| Ester prepared in reaction of [4-(7,8-dihydroxy-2,4,4-trimethyl-2-chromanyl)pyrogallol] with o-naphthoquinone diazide-5-sulfonic acid: | 6.0 g |

2) Preparation of Glass Substrate having Undercoat Layer

Resist GT-2000L solution (manufactured by Fuji Film Electronic Materials Co., Ltd.) was spin-coated on a glass substrate to a film thickness of 2 μm, and dried under heat at 220° C. for 1 hour, to form a hardened film (undercoat layer).

3) Exposure and Development (Image Formation) of Dye-Containing Curable Composition Each of the dye-containing curable compositions obtained in 1) was spin-coated on the undercoat layer on the glass substrate obtained in 2) to a film thickness of 1 μm and prebaked at 100° C. for 120 seconds.

The coated film was then exposed to light through a mask of 2 cm square by using a UV exposure device. After irradiation, the film was developed at 23° C. for 60 seconds, by using 100% CD-2000 developer (manufactured by Fuji Film Electronic Materials Co., Ltd.) (in Examples 1 to 17 and Comparative Example 1) or FHD-5 developer (manufactured by Fuji Film Electronic Materials Co., Ltd.) (in Examples 18 to 19). The film was then washed with running water for 20 seconds and spray-dried, to give a patterned image (color filter).

4) Evaluation

Each of the dye-containing curable compositions (1) to (22) obtained in Examples and Comparative Examples was evaluated as follows: Evaluation results are summarized in the following Table 2.

—1. Pattern-Forming Property—

The patterned image formed above was measured by ordinary method under an optical microscope, and evaluated according to the following criteria.

(Evaluation Criteria)

A: Distinct pattern obtained without development residue in the unexposed portion B: Significant development residue present in unexposed area —2. Heat Resistance and Light Resistance—

The film was coated and prebaked in a similar manner to 3) above and heated at 200° C. for 5 minutes to be hardened; and the hardened film was measured spectroscopically in MCPD-1000 (manufactured by Otsuka Electronics Co., Ltd.), and a reference value was obtained. The hardened film was further subjected to the following treatment (a) or (b).

(a) <Heat Resistance>

The glass substrate having the hardened film was placed on a hot plate at 200° C. for 1 hour, the film was measured spectroscopically again; and a spectroscopic value after heating relative to the reference value above was obtained; the difference between them ΔE*ab, was obtained from these values, according to a chromaticity-calculating program.

(b) <Light Resistance>

The glass substrate having the hardened film was exposed to light at 200,000 luxes for 20 hours in a light resistance tester (manufactured by Suga Test Instrument Co. Ltd.); the spectroscopic measurement was conducted again, to give a spectroscopic value after light exposure relative to the reference value; and the difference between them, ΔE*ab, was obtained according to the chromaticity-calculating program.

TABLE 2

|  | Pattern-forming property | Heat resistance ΔE * ab | Light resistance ΔE * ab |
| --- | --- | --- | --- |
| Example 1 | A | 2.5 | 3.3 |
| Example 2 | A | 2.4 | 3.2 |
| Example 3 | A | 2.3 | 3.6 |
| Example 4 | A | 2.5 | 3.2 |
| Example 5 | A | 2.4 | 3.5 |
| Example 6 | A | 2.5 | 3.1 |
| Example 7 | A | 2.5 | 3.5 |
| Example 8 | A | 2.1 | 2.2 |
| Example 9 | A | 2.0 | 2.1 |
| Example 10 | A | 2.1 | 2.3 |
| Example 11 | A | 2.0 | 2.2 |
| Example 12 | A | 2.1 | 2.2 |
| Example 13 | A | 2.1 | 2.1 |
| Example 14 | A | 2.0 | 2.3 |
| Example 15 | A | 2.1 | 2.5 |
| Example 16 | A | 2.1 | 2.2 |
| Example 17 | A | 2.1 | 2.2 |
| Example 18 | A | 1.9 | 1.9 |
| Example 19 | A | 1.8 | 1.8 |
| Example 20 | A | 2.2 | 2.3 |
| Example 21 | A | 2.1 | 2.2 |
| Comparative Example 1 | B | 5.9 | 6.6 |

As shown in Table 2, the hardened films obtained in Examples were superior in light resistance and heat resistance, and also in pattern-forming property. In contrast, the hardened film obtained in Comparative Example 1 showed significant development residues in the unexposed portion, and was inferior in pattern-forming property and also insufficient in light resistance and beat resistance after hardening.

In addition to the colorant compounds according to the invention used in Examples above, the specific examples of the colorant compounds according to the invention described above structurally show an action similar to that of the specific examples (colorant compound according to the invention) used above, and thus, are similarly superior in light resistance and heat resistance and also give favorable pattern-forming property.

Thus, the invention provides a colorant-containing curable composition favorable in color tone (molar absorption coefficient and color value) and vividness and superior in light resistance, beat resistance, and pattern-forming property (developing property), a color filter having a high-definition pattern (in particular, having a favorably rectangular cross-sectional shape) that is favorable in color tone and superior in light resistance and heat resistance, and a method of producing a color filter that prevents development residue in the unhardened area and allows production of the color filter with high productivity (high cost performance).

All publications, patent applications, and technical standards mentioned in this specification are herein incorporated by reference to the same extent as if each individual publication, patent application, or technical standard was specifically and individually indicated to be incorporated by reference.

What is claimed is:

1. A colorant-containing curable composition comprising a colorant, wherein the colorant comprises a compound represented by formula 1) or its tautomer, a monomer, a binder, and a photopolymerization initiator:

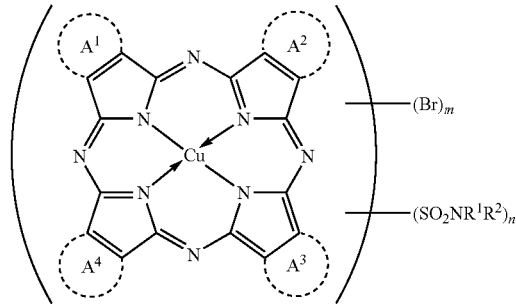

wherein in formula (1), rings $A^1$, $A^2$, $A^3$, and $A^4$ each independently represent a group represented by structure 1 or 2:

Structure 1

Structure 2 wherein at least one of rings $A^1$, $A^2$, $A^3$, and $A^4$ represents a group represented by structure 2; $R^1$ represents a hydrogen atom or a substituted or unsubstituted alkyl group; $R^2$ represents a substituted alkyl group containing at least one oxygen atom in the form of at least one of an ether, carbonyl, or ester bond; m represents an integer of 1 to 8; and n is an integer of 1 to 4.

2. The colorant-containing curable composition according to claim 1, wherein $R^1$ in formula (1) represents a hydrogen atom, an unsubstituted alkyl group, or a substituted alkyl group containing oxygen atoms in the form of at least one of an ether, carbonyl, or ester bond.

3. The colorant-containing curable composition according to claim 1, wherein $R^1$ in formula (1) represents a hydrogen atom, an unsubstituted alkyl group having 1 to 12 carbon atoms, or a substituted alkyl group having 2 to 12 carbon atoms containing one to four oxygen atoms oxygen atom in the form of at least one of an ether, carbonyl, or ester bond, and m is an integer of 1 to 4.

4. The colorant-containing curable composition according to claim 1, wherein at least one of $R^1$ and $R^2$ in formula (1) represents a substituted alkyl group having 2 to 12 carbon atoms containing one to four oxygen atoms in the form of at least one of an ether, carbonyl, or ester bond.

5. The colorant-containing curable composition according to claim 4, wherein at least one of $R^1$ and $R^2$ in formula (1) represents a substituted alkyl group represented by formula (2):

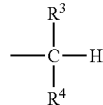

wherein in formula (2), $R^3$ and $R^4$ each independently represent a hydrogen atom, an unsubstituted alkyl group, an alkyl group containing oxygen atoms in the form of at least one of an ether, carbonyl, or ester bond, an alkylcarbonyl group, or an alkoxycarbonyl group; and at least one of $R^3$ and $R^4$ represents an alkyl group containing oxygen atoms in the form of at least one of an ether, carbonyl, or ester bond, an alkylcarbonyl group, or an alkoxycarbonyl group.

6. The colorant-containing curable composition according to claim 1, wherein the monomer includes a (meth)acrylic ester-based monomer.

7. The colorant-containing curable composition according to claim 1, wherein the monomer includes a tetra- or higher-functional (meth)acrylic ester-based monomer.

8. The colorant-containing curable composition according to claim 1, wherein the binder includes an alkali-soluble (meth)acrylic resin.

9. The colorant-containing curable composition according to claim 1, wherein the photopolymerization initiator includes at least one compound selected from a trihalomethyl-s-triazine compound, a benzyldimethyl ketal compound, an α-hydroxyketone compound, an α-aminoketone compound, a phosphine oxide compound, a metallocene compound, an oxime compound, a triallylimidazole dimer, a benzothiazole compound, a benzophenone compound, an acetophenone compound or a derivative thereof, a cyclopentadiene-benzene-iron complex or a salt thereof, a halomethyloxadiazole compound, or a 3-aryl substituted coumarin compound.

10. The colorant-containing curable composition according to claim 1, wherein the photopolymerization initiator is at least one compound selected from an α-aminoketone compound, a phosphine oxide compound, a metallocene compound, an oxime compound, or a triallylimidazole dimer.

11. A color filter prepared by using the colorant-containing curable composition according to claim 1.

12. A method of producing a color filter, comprising applying the colorant-containing curable composition of claim 1 onto a substrate, exposing the composition through a mask to light, and forming a pattern by developing the composition.

13. A colorant-containing curable composition comprising a colorant, wherein the colorant comprises a compound represented by formula (1) or its tautomer:

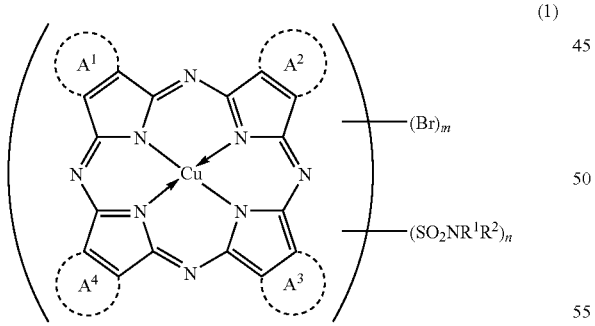

(1)

wherein in formula (1), rings $A^1$, $A^2$, $A^3$, and $A^4$ each independently represent a group represented by structure 1 or 2:

Structure 1

Structure 2

wherein at least one of rings $A^1$, $A^2$, $A^3$, and $A^4$ represents a group represented by structure 2; $R^1$ represents a hydrogen atom or a substituted or unsubstituted alkyl group; $R^2$ represents a substituted alkyl group containing at least one oxygen atom in the form of at least one of an ether, carbonyl, or ester bond; m represents an integer of 1 to 8; and n is an integer of 1 to 4, further comprising a photosensitive agent and a hardening agent, wherein the composition is a positive composition.

14. The colorant-containing curable composition according to claim 13, wherein the photosensitive agent is an o-benzoquinonediazidesulfonic ester or an o-naphthoquinone diazide sulfonic ester.

15. A colorant-containing curable composition comprising a colorant, wherein the colorant comprises a compound represented by formula (1) or its tautomer:

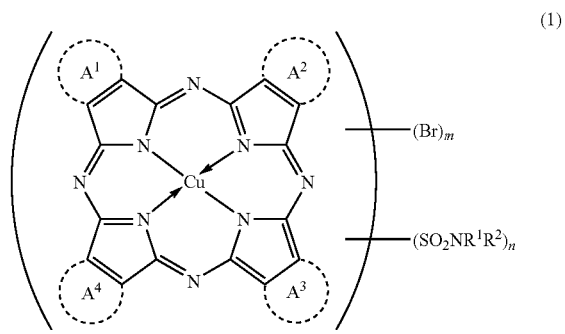

(1)

wherein in formula (1), rings $A^1$, $A^2$, $A^3$, and $A^4$ each independently represent a group represented by structure 1 or 2:

Structure 1

Structure 2

wherein at least one of rings $A^1$, $A^2$, $A^3$, and $A^4$ represents a group represented by structure 2; $R^1$ represents a hydrogen atom or a substituted or unsubstituted alkyl group; $R^2$ represents a substituted alkyl group containing at least one oxygen atom in the form of at least one of an ether, carbonyl, or ester bond; m represents an integer of 1 to 8; and n is an integer of 1 to 4, further comprising a photochemical acid generator and a hardening agent, wherein the composition is a positive composition.

16. A color filter, comprising a compound represented by formula (1) or its tautomer:

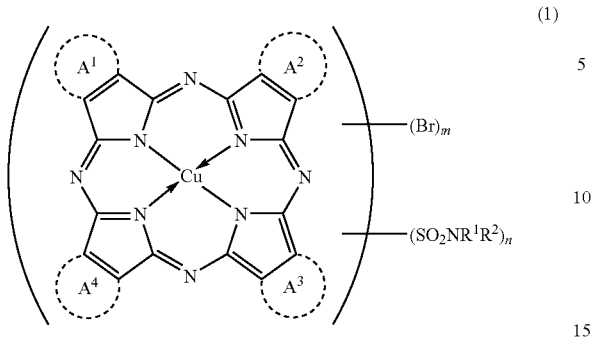

(1)

—(Br)$_m$

—(SO$_2$NR$^1$R$^2$)$_n$ wherein in formula (1), rings A$^1$, A$^2$, A$^3$, and A$^4$ each independently represent a group represented by structure 1 or 2:

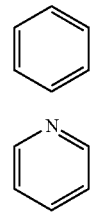

Structure 1

Structure 2 wherein at least one of rings A$^1$, A$^2$, A$^3$, and A$^4$ represents a group represented by structure 2; R$^1$ and R$^2$ each independently represent a hydrogen atom or a substituted or unsubstituted alkyl group; R$^1$ and R$^2$ are not hydrogen atoms at the same time; m represents an integer of 1 to 8; and n is an integer of 1 to 4.

* * * * *